United States Patent
Dehe et al.

(10) Patent No.: US 9,309,105 B2
(45) Date of Patent: Apr. 12, 2016

(54) SENSOR STRUCTURE FOR SENSING PRESSURE WAVES AND AMBIENT PRESSURE

(71) Applicant: Infineon Technologies AG, Neubiberg (DE)

(72) Inventors: Alfons Dehe, Reutlingen (DE); Roland Helm, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 36 days.

(21) Appl. No.: 14/198,645

(22) Filed: Mar. 6, 2014

(65) Prior Publication Data

US 2015/0251899 A1   Sep. 10, 2015

(51) Int. Cl.

| | |
|---|---|
| *H01L 29/84* | (2006.01) |
| *H01L 21/00* | (2006.01) |
| *B81B 7/00* | (2006.01) |
| *G01L 1/14* | (2006.01) |
| *G01L 13/02* | (2006.01) |
| *H04R 23/00* | (2006.01) |
| *G01L 9/00* | (2006.01) |

(52) U.S. Cl.
CPC ............... *B81B 7/0041* (2013.01); *G01L 1/14* (2013.01); *G01L 9/0041* (2013.01); *G01L 9/0073* (2013.01); *G01L 13/025* (2013.01); *H04R 23/00* (2013.01); *B81B 2201/0264* (2013.01); *G01L 9/0072* (2013.01); *H04R 2201/003* (2013.01)

(58) Field of Classification Search
CPC ........... G01L 9/72; G01L 9/73; G01L 13/025; G01L 1/14; B81B 2201/0264

USPC ............................... 438/415–420; 257/50–53
See application file for complete search history.

(56) References Cited

U.S. PATENT DOCUMENTS

| | | | | |
|---|---|---|---|---|
| 8,258,591 B2* | 9/2012 | Lee et al. | .................. | 257/416 |
| 8,334,159 B1* | 12/2012 | Fu | .................. | 438/53 |
| 2005/0229710 A1* | 10/2005 | O'Dowd et al. | .................. | 73/718 |
| 2006/0150739 A1* | 7/2006 | Yasuda et al. | .................. | 73/654 |
| 2007/0134835 A1* | 6/2007 | Fukuda et al. | .................. | 438/48 |
| 2007/0284682 A1* | 12/2007 | Laming et al. | .................. | 257/416 |
| 2009/0152655 A1* | 6/2009 | Laming et al. | .................. | 257/416 |
| 2014/0053651 A1* | 2/2014 | Besling et al. | .................. | 73/702 |
| 2014/0077317 A1* | 3/2014 | Hsieh et al. | .................. | 257/416 |
| 2014/0268523 A1* | 9/2014 | Gogoi | .................. | 361/679.01 |
| 2015/0001647 A1 | 1/2015 | Dehe et al. | | |

OTHER PUBLICATIONS

ChuanChe Wang, et al., Contamination-Intensitive Differential Capacitive Pressure Sensors, Journal of Microelectromechanical Systems, vol. 9, No. 4, Dec. 2000, pp. 1-6.
Jesper Bay, et al., Design of a Silicon Microphone with Differential Read-Out of a Sealed Double Parallel-Plate Capacitor, the 8th International Conference on Solid-State Sensors and Actuators, and Eurosensors IX, Stockholm, Sweden, Jun. 25-29, 1995, pp. 1-4.

* cited by examiner

*Primary Examiner* — Karen Kusumakar
(74) *Attorney, Agent, or Firm* — Viering, Jentschura & Partner MBB

(57) ABSTRACT

In various embodiments, a sensor structure is provided. The sensor structure may include a first conductive layer; an electrode element; and a second conductive layer arranged on an opposite side of the electrode element from the first conductive layer. The first conductive layer and the second conductive layer may form a chamber. The pressure in the chamber may be lower than the pressure outside of the chamber.

14 Claims, 22 Drawing Sheets

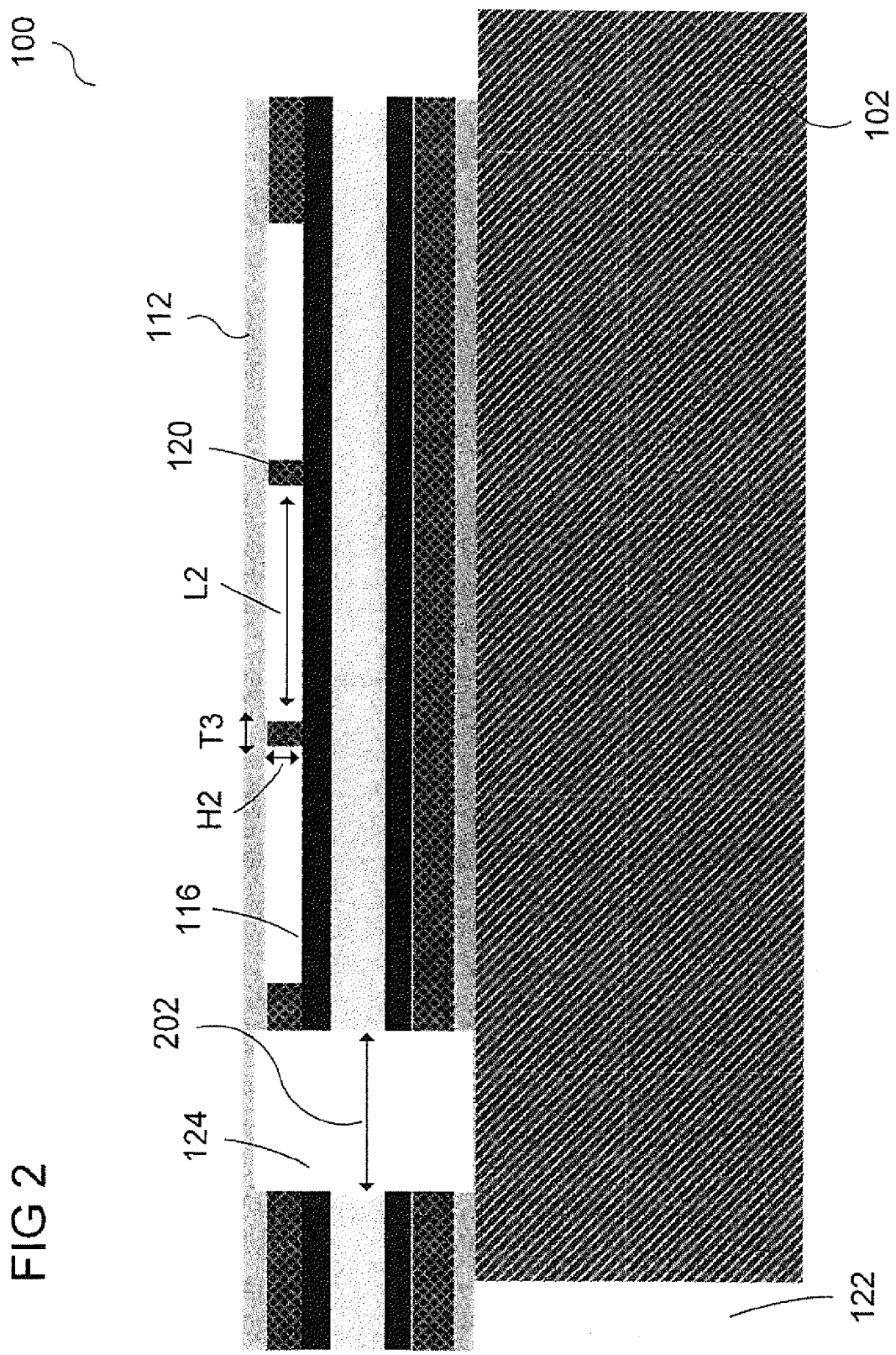

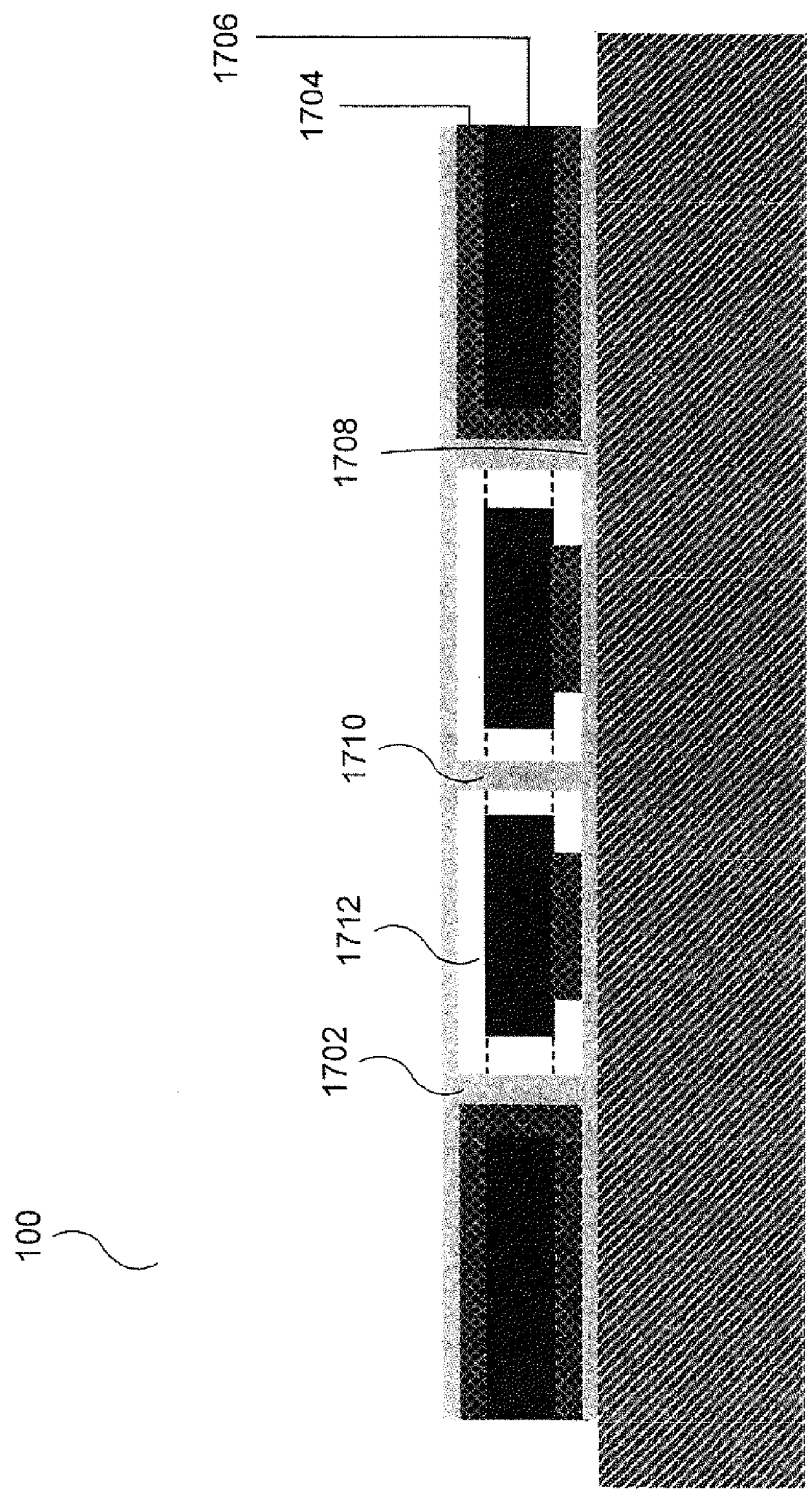

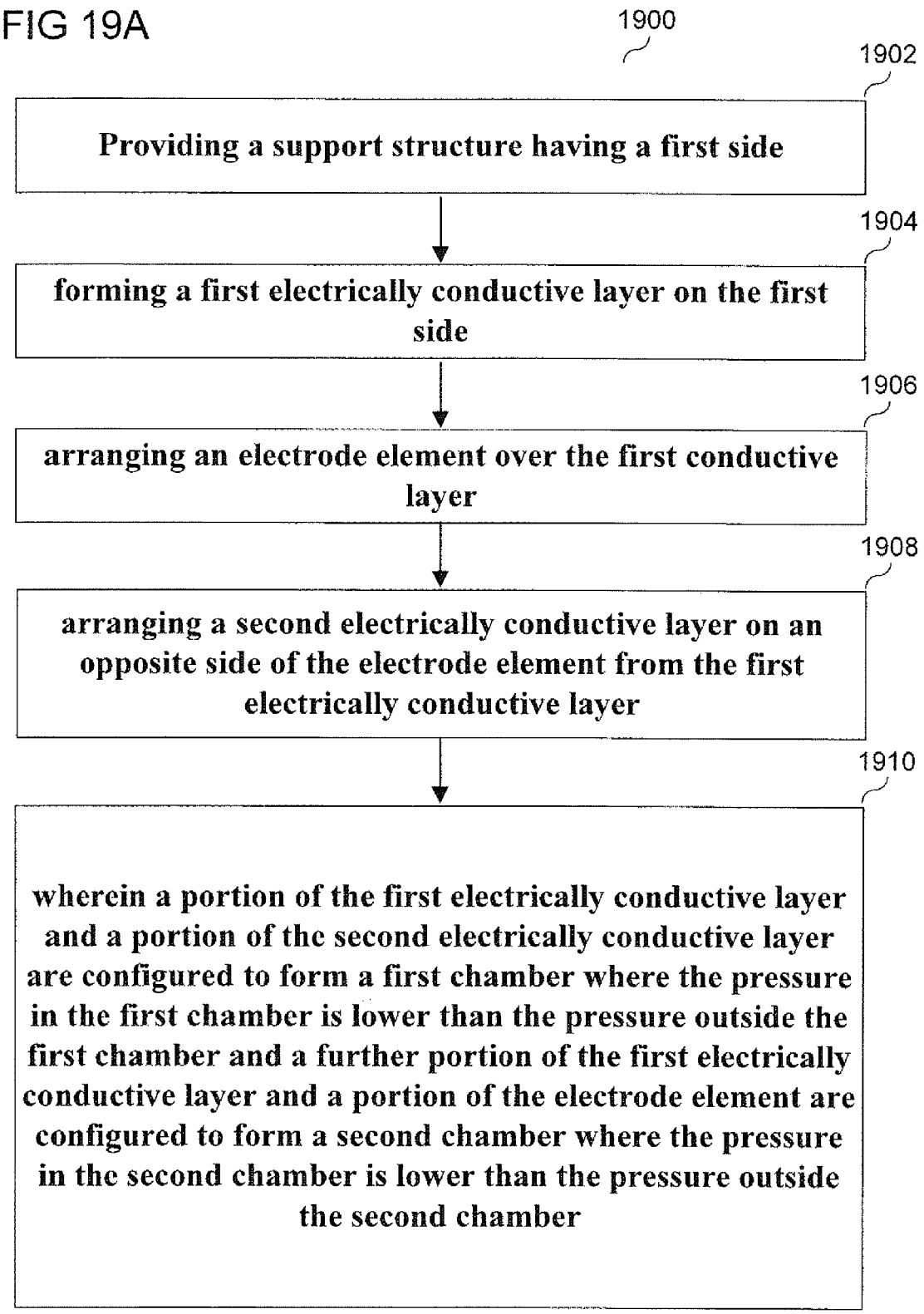

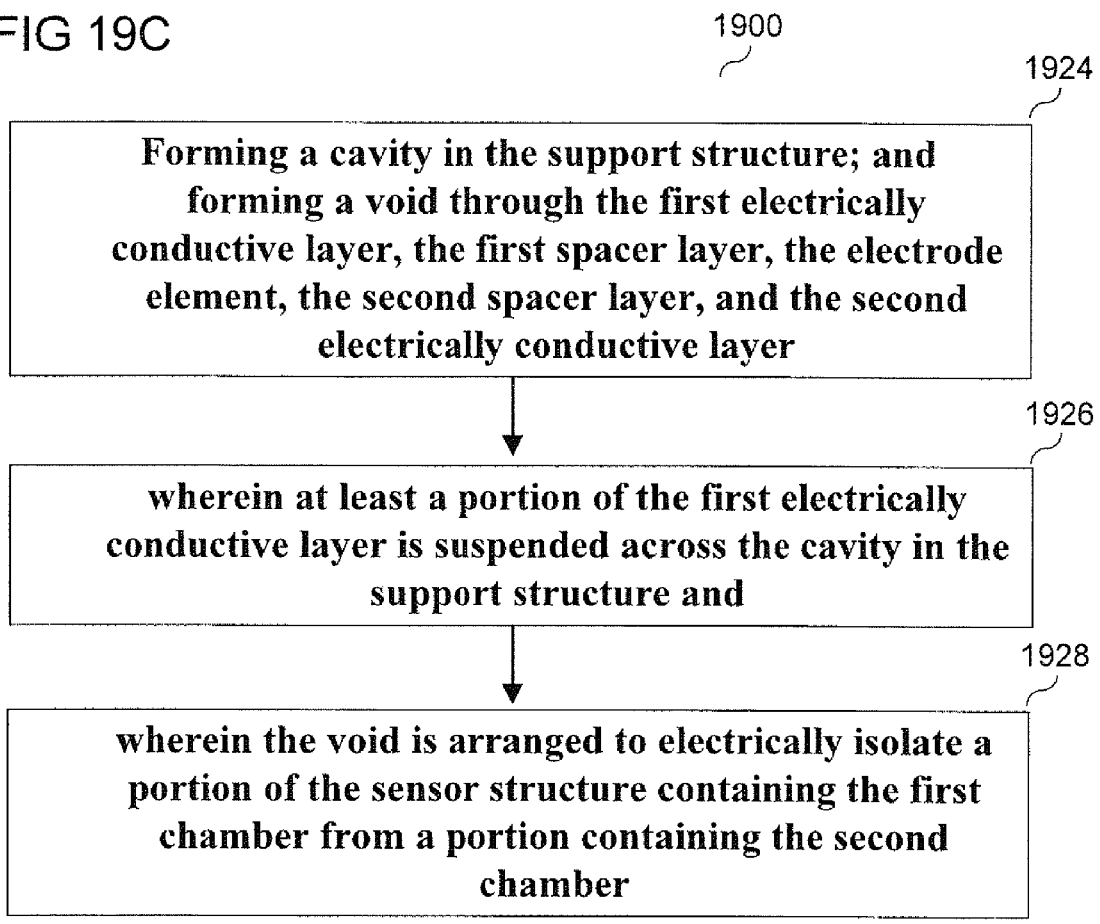

SENSOR STRUCTURE FOR SENSING PRESSURE WAVES AND AMBIENT PRESSURE

TECHNICAL FIELD

Various embodiments relate generally to a sensor structure for sensing pressure waves and ambient pressure. The sensor structure may be capable of sensing both a change in ambient pressure and the magnitude of pressure waves which may impinge on the sensor structure.

BACKGROUND

Many electronic devices use a variety of sensors, e.g. accelerometers, gyroscopes, magnetic field sensors, microphones, and pressure sensors. Many of these sensors may be integrated into a single sensor package. These sensor packages typically include a protective resin or epoxy layer formed over the sensors to provide increased durability and resistance to various environmental factors. However, in order to function correctly, some sensors cannot be encapsulated by a protective layer, e.g. microphones and pressure sensors. A typical microphone has a diaphragm that is exposed to incident pressure waves. These pressure waves cause the diaphragm to deflect and this deflection is detected by a various transduction mechanisms and converted into a measurable electric signal. In a micro-electro-mechanical system (MEMS) microphone, conventional transduction mechanisms may include piezoelectric, piezoresistive, optical, and capacitive mechanisms. Many MEMS pressure sensors likewise employ these types of transduction mechanisms to sense a change in ambient pressure.

SUMMARY

In various embodiments, a sensor structure is provided. The sensor structure may include a first conductive layer; an electrode element; and a second conductive layer arranged on an opposite side of the electrode element from the first conductive layer. The first conductive layer and the second conductive layer may form a chamber. The pressure in the chamber may be lower than the pressure outside of the chamber.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosure. In the following description, various embodiments of the disclosure are described with reference to the following drawings, in which:

FIG. 2 shows various potential aspects of a portion of the sensor structure from FIG. 1A which may be used to sense a change in ambient pressure;

FIG. 17 shows a cross-sectional view of a potential embodiment of the sensor structure shown in FIGS. 4 to 15;

FIGS. 19A to 19C illustrate, in flowchart form, various methods which may be implemented to manufacture the sensor structure represented in FIGS. 1 to 17.

DETAILED DESCRIPTION

The following detailed description refers to the accompanying drawings that show, by way of illustration, specific details and embodiments in which the disclosure may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In various embodiments, a diaphragm may include a plate or a membrane. A plate may be understood as being a diaphragm being under pressure. Furthermore, a membrane may be understood as being a diaphragm being under tension. Although various embodiments will be described in more detail below with reference to a membrane, it may be alternatively provided with a plate, or in general with a diaphragm.

Figure 1A:
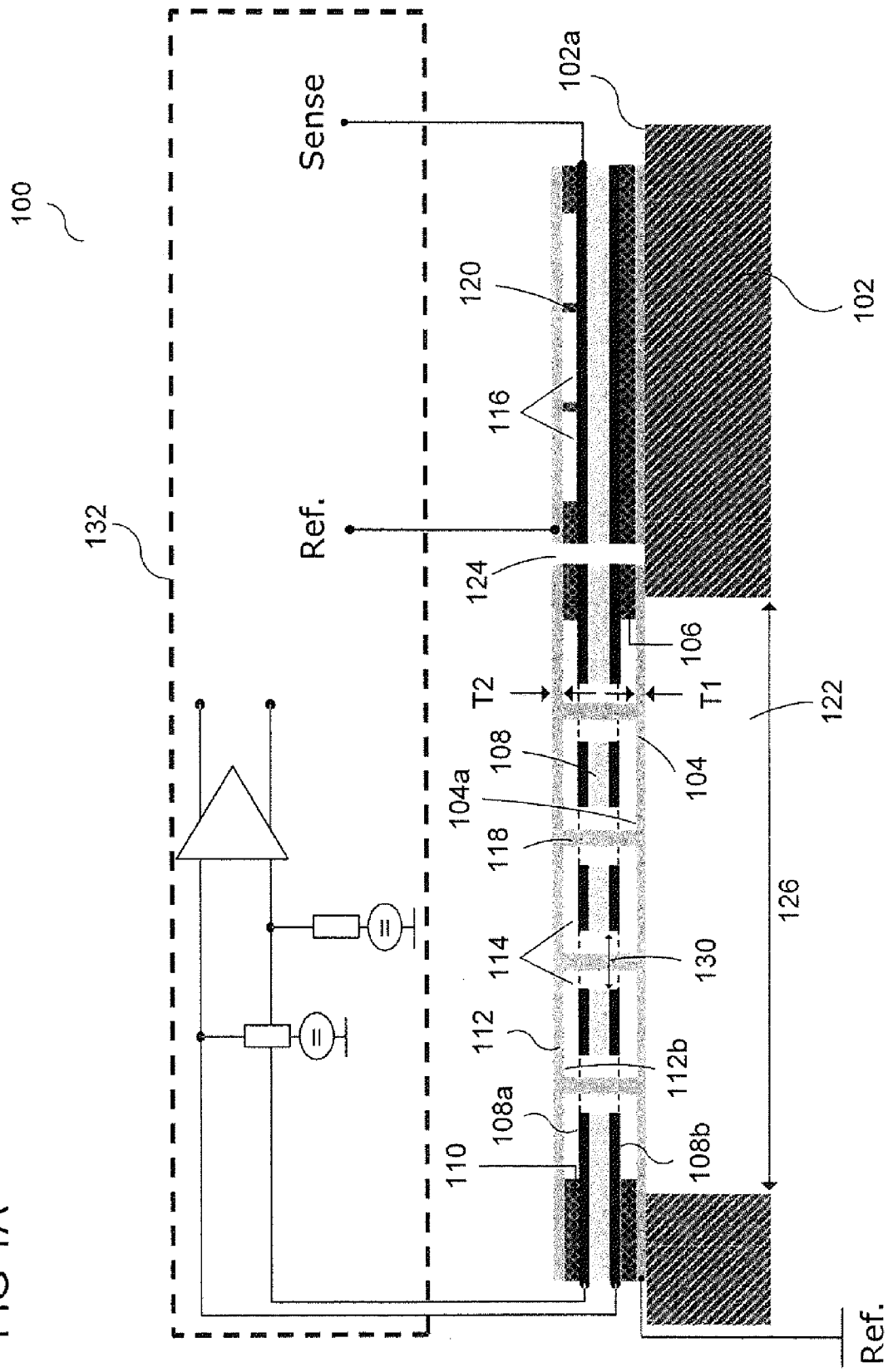
FIG. 1A shows, in accordance with various embodiments, a perspective cross sectional view of a sensor structure with a region for sensing a change in ambient pressure and a region for sensing the magnitude of an incident pressure wave.

According to various embodiments, a sensor structure 100 is provided. As illustrated in FIG. 1A, the sensor structure 100 may include a support structure 102 with a first electrically conductive layer 104 formed on a surface of the support structure 102, an electrode element 108, and a second electrically conductive layer 112 arranged on an opposite side of the electrode element 108 from the first electrically conductive layer 104.

According to various embodiments, the sensor structure 100 may further include a portion of the first electrically conductive layer 104 and a portion of the second electrically conductive layer 112 configured to form a first chamber 114. The pressure in the first chamber 114 may be lower than the pressure outside the first chamber 114. The pressure in the first chamber 114 may be in the range from about 0.5 mbar to about 10 mbar, e.g. in the range from about 0.5 mbar to about 1 mbar, e.g. in the range from about 1 mbar to about 1.5 mbar, e.g. in the range from about 2 mbar to about 2.5 mbar, e.g. in the range from about 2.5 mbar to about 3 mbar, e.g. in the range from about 3 mbar to about 5 mbar, e.g. in the range from about 5 mbar to about 10 mbar.

According to various embodiments, a further portion of the second electrically conductive layer 112 and a portion of the electrode element 108 may form a second chamber 116 and the pressure in the second chamber 116 may be lower than the pressure outside the second chamber 116. The pressure in the second chamber 116 may be in the range from about 0.5 mbar to about 10 mbar, e.g. in the range from about 0.5 mbar to about 1 mbar, e.g. in the range from about 1 mbar to about 1.5 mbar, e.g. in the range from about 2 mbar to about 2.5 mbar, e.g. in the range from about 2.5 mbar to about 3 mbar, e.g. in the range from about 3 mbar to about 5 mbar, e.g. in the range from about 5 mbar to about 10 mbar.

According to various embodiments, the sensor structure 100 may further include a first pillar structure 118 arranged in the first chamber 114 between the first electrically conductive layer 104 and the second electrically conductive layer 112. The sensor structure 100 may also include a second pillar structure 120 arranged in the second chamber 116 between the second electrically conductive layer 112 and the electrode element 108.

According to various embodiments, the sensor structure 100 may include a cavity 122 formed in the support structure 102. The cavity 122 may be arranged in the support structure 102 such that a portion of the first electrically conductive layer 104 may be suspended across the cavity 122.

According to various embodiments, the sensor structure 100 may include a void 124 formed through a portion of the first electrically conductive layer 104, the first spacer layer 106, the electrode element 108, the second spacer layer 110, and the second electrically conductive layer 112. According to various embodiments, the void 124 may be formed through a portion of the first electrically conductive layer 104, the first spacer layer 106, the electrode element 108, and the second spacer layer 110 without extending through the second conductive layer 112. The void 124 may be arranged such that the portion of the sensor structure which may contain the first chamber 114 and the portion of the sensor structure 100 which may contain the second chamber 116 may be electrically isolated from one another.

Figure 1B:
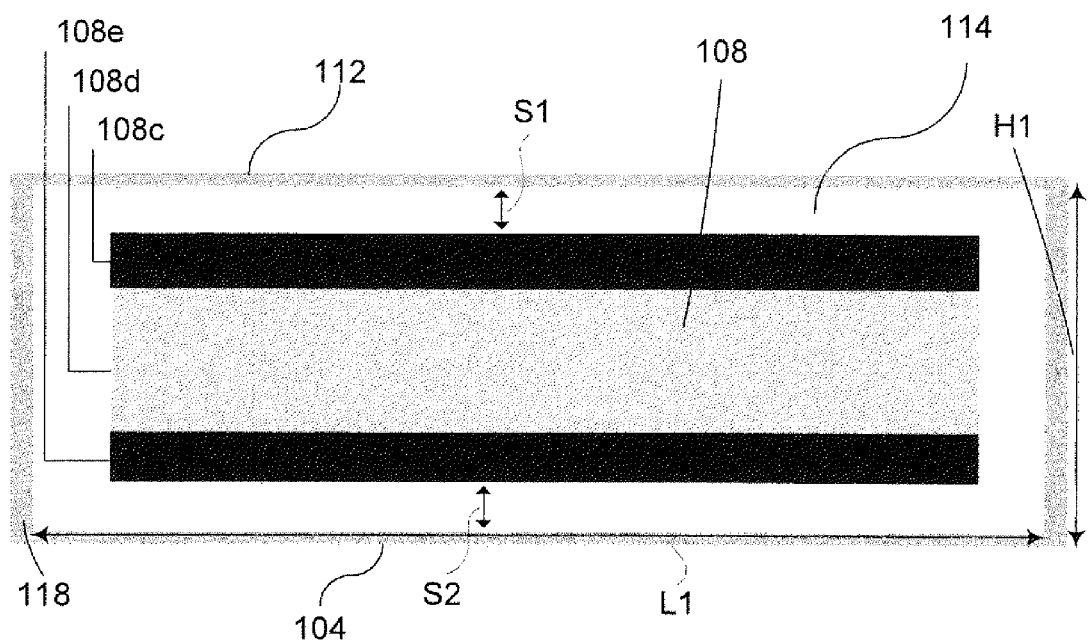
FIGS. 1B and 1C show a perspective cross-sectional, highly abstracted view of an individual chamber which may be implemented in the sensor structure from FIG. 1A for sensing the magnitude of an incident pressure wave.
Figure 1C:
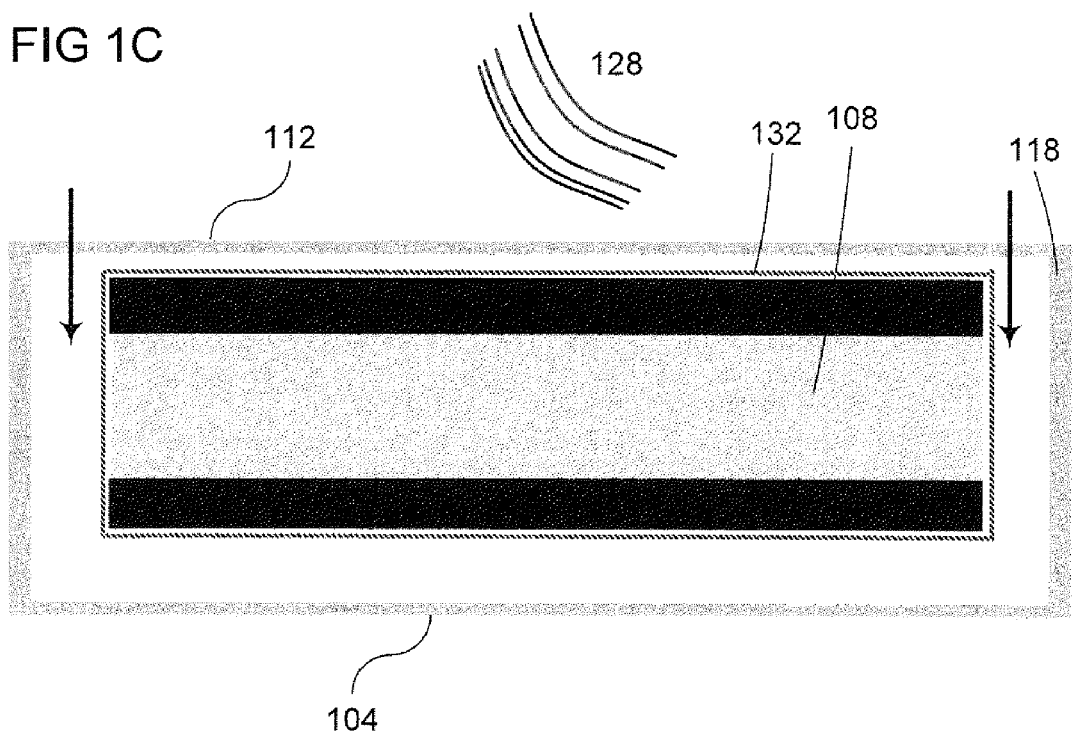
Figure 3A:
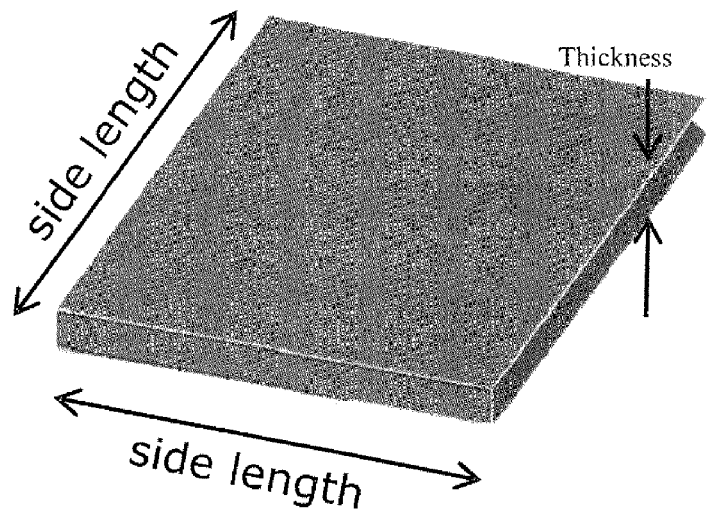
FIGS. 3A and 3B graphically illustrate the results of calculations for membrane deflection under 1 bar pressure (ambient pressure) of a unit square segment of a stress-free polysilicon diaphragm for different thicknesses and side lengths.
Figure 3B:
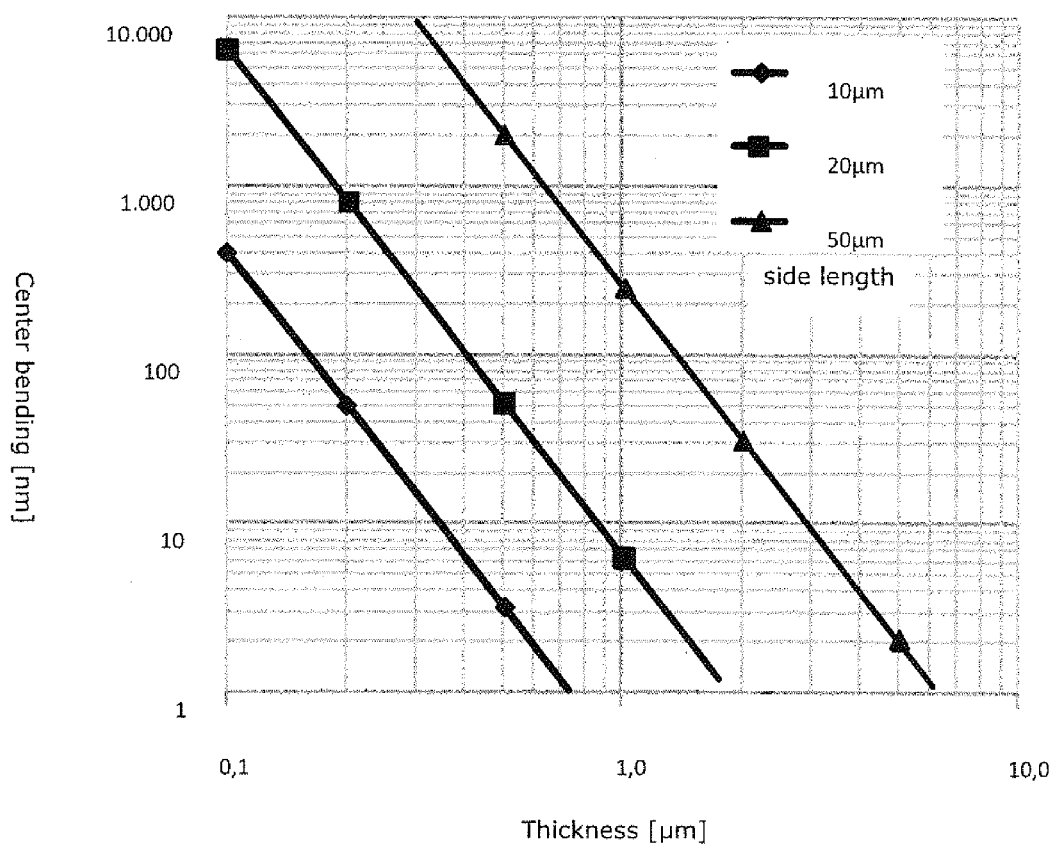

FIGS. 1B and 1C show an isolated view of a section of the first chamber 114 where, according to various embodiments, sound waves 128, incident on the second electrically conductive layer 112 may cause the chamber to deflect relative to the electrode element 108. As the first chamber 114 may deflect due to the sound waves 128, the second electrically conductive layer 112 may deflect in a direction substantially toward the electrode element 108 while the first electrically conductive layer 104 may simultaneously be deflected in substantially the same direction as the second electrically conductive layer and therefore may move away from the electrode element 108. Since the first electrically conductive layer 104 may be fixed to the second electrically conductive layer 112 by the first pillar structure 118, the magnitude of the deflection of the first and second electrically conductive layers 104 and 112 may be substantially equal.

According to various embodiments, signals may be generated by the movement of the first and second electrically conductive layers 104 and 112. The signals may then be compared by one or more processing circuits, such as optional processing circuitry 132, and converted to useable information as may be desirable for a given application, e.g. sensing a change in pressure, e.g. detecting the magnitude of pressure waves incident on first and second electrically conductive layers 104 and 112. According to various embodiments, a change in the distance between the first and second electrically conductive layers 104 and 112 may cause a change in the capacitance generated between the first and second electrically conductive layers 104 and 112. According to various embodiments, this change in capacitance may be detected by one or more processing circuits, such as the optional circuitry 132.

According to various embodiments, the support structure 102 may be a semiconductor substrate, such as a silicon substrate. According to various embodiments, the support structure 102 may include or essentially consist of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as may be desired for a given application. The support structure 102 may include or essentially consist of other materials or combinations of material, for example various dielectrics, metals, and polymers as are desirable for a given application. According to various embodiments, the support structure 102 may include or essentially consist of, for example, glass, and/or various polymers. The support structure 102 may be a silicon-on-insulator (SOI) structure. According to various embodiments, the support structure 102 may be a printed circuit board.

According to various embodiments, the cavity 122 may formed in the support structure 102 by means of various techniques, e.g. isotropic gas phase etching, vapor etching, wet etching, isotropic dry etching, plasma etching, laser drilling, various grinding techniques, etc.

According to various embodiments, the cavity 122 may be square or substantially square in shape. The cavity 122 may be rectangular or substantially rectangular in shape. According to various embodiments, the cavity 122 may be a circle or substantially circular in shape. The cavity 122 may be an oval or substantially oval in shape. According to various embodiments, the cavity 122 may be a triangle or substantially triangular in shape. The cavity 122 may be a cross or substantially cross shaped. According to various embodiments, the cavity 122 may be formed into any shape that may be desired for a given application. According to various embodiments, a distance 126 across the cavity 122 may be, for example, in the range from about 0.5 mm to about 5 mm, e.g. in the range from about 0.5 mm to about 1 mm, e.g. in the range from about 1 mm to about 1.5 mm, e.g. in the range from about 1.5 mm to about 2 mm, e.g. in the range from about 2 mm to about 2.5 mm, e.g. in the range from about 2.5 mm to about 3 mm, e.g. in the range from about 3 mm to about 5 mm.

According to various embodiments, the first electrically conductive layer 104 may be formed over a top surface 102a of the support structure 102 by means of various fabrication techniques, e.g. physical vapor deposition, electrochemical deposition, chemical vapor deposition, and molecular beam epitaxy.

According to various embodiments, the first electrically conductive layer 104 may have a thickness T1 in the range, e.g. from about 300 nm to about 10 µm, e.g. in the range from about 300 nm to about 400 nm, e.g. in the range from about 400 nm to about 500 nm, e.g. in the range from about 500 nm to about 1 µm, e.g. in the range from about 1 µm to about 3 µm, e.g. in the range from about 3 µm to about 5 µm, e.g. in the range from about 5 µm to about 10 µm.

According to various embodiments, the first electrically conductive layer 104 may include or essentially consist of a semiconductor material such as, e.g. silicon. According to various embodiments, the first electrically conductive layer 104 may include or essentially consist of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. The first electrically conductive layer 104 may include or essentially consist of at least one of a metal, a dielectric material, a piezoelectric material, a piezoresistive material, and a ferroelectric material. According to various embodiments, the first electrically conductive layer 104 may be implemented as a membrane structure. According to various embodiments, the first electrically conductive layer 104 may be implemented as a diaphragm structure.

According to various embodiments, the first spacer layer 106 may be formed over at least a portion of a top surface 104a of the first electrically conductive layer 104 by means of various fabrication techniques, e.g. physical vapor deposition, electrochemical deposition, chemical vapor deposition, and molecular beam epitaxy. According to various embodiments, at least a portion of the first spacer layer 106 may be arranged between a bottom surface 108b of the electrode element 108 and the top surface 104a of the first electrically conductive layer 104.

According to various embodiments, the first spacer layer 106 may include or essentially consist of various dielectrics, such as, for example, a silicon oxide, silicon nitride, tetraethyl orthosilicate, borophosphosilicate glass, and various plasma oxides. According to various embodiments, the first spacer layer 106 may have a thickness in the range, e.g. from about 300 nm to about 10 µm, e.g. in the range from about 300 nm to about 400 nm, e.g. in the range from about 400 nm to about 500 nm, e.g. in the range from about 500 nm to about 1 µm, e.g. in the range from about 1 µm to about 3 µm, e.g. in the range from about 3 µm to about 5 µm, e.g. in the range from about 5 µm to about 10 µm.

According to various embodiments, the second spacer layer 110 may be formed over at least a portion of a top surface 108a of the electrode element 108 by means of various fabrication techniques, e.g. physical vapor deposition, electrochemical deposition, chemical vapor deposition, and molecular beam epitaxy. According to various embodiments, at least a portion of the second spacer layer 110 may be arranged between the top surface 108a of the electrode element 108 and a bottom surface 112b of the second electrically conductive layer 112.

According to various embodiments, the second spacer layer 110 may include or essentially consist of various dielectrics, such as, for example, a silicon oxide, silicon nitride, tetraethyl orthosilicate, borophosphosilicate glass, and various plasma oxides. According to various embodiments, the second spacer layer 110 may have a thickness in the range, e.g. from about 300 nm to about 10 µm, e.g. in the range from about 300 nm to about 400 nm, e.g. in the range from about 400 nm to about 500 nm, e.g. in the range from about 500 nm to about 1 µm, e.g. in the range from about 1 µm to about 3 µm, e.g. in the range from about 3 µm to about 5 µm, e.g. in the range from about 5 µm to about 10 µm.

According to various embodiments, the first spacer layer 106 and the second spacer layer 110 may be composed from the same material.

According to various embodiments, the second electrically conductive layer 112 may have a thickness T2 in the range, e.g. from about 300 nm to about 10 µm, e.g. in the range from about 300 nm to about 400 nm, e.g. in the range from about 400 nm to about 500 nm, e.g. in the range from about 500 nm to about 1 µm, e.g. in the range from about 1 µm to about 3 µm, e.g. in the range from about 3 µm to about 5 µm, e.g. in the range from about 5 µm to about 10 µm.

According to various embodiments, the second electrically conductive layer 112 may include or essentially consist of a semiconductor material such as, e.g. silicon. According to various embodiments, the second electrically conductive layer 112 may include or essentially consist of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. The second electrically conductive layer 112 may include or essentially consist of at least one of a metal, a dielectric material, a piezoelectric material, a piezoresistive material, and a ferroelectric material. According to various embodiments, the second electrically conductive layer 112 may be implemented as a membrane structure. According to various embodiments, the second electrically conductive layer 112 may be implemented as a diaphragm structure.

According to various embodiments, the first electrically conductive layer 104, the electrode element 108, the second electrically conductive layer 112, and the spacer layers 106 and 110 may be arranged in a stack structure. The first electrically conductive layer 104, the electrode element 108, the second electrically conductive layer 112, and the spacer layers 106 and 110 may be implemented as a type of laminate structure.

According to various embodiments, as illustrated in FIG. 1B, the electrode element 108 may include a first conductive element 108c, an electrical insolation element 108d, and a second conductive element 108e. According to various embodiments, the first conductive element 108c and the second conductive element 108e may include or essentially consist of the same conductive material. According to various embodiments the first conductive element 108c and the second conductive element 108e may include or essentially consist of different conductive materials.

According to various embodiments the first conductive element 108c of the electrode element 108 may include or essentially consist of various metals, e.g. aluminum, silver, copper, nickel, and various alloys such as aluminum-silver and cupronickel.

According to various embodiments the first conductive element 108c of the electrode element 108 may include or essentially consist of various semiconductor materials which may be doped such that they are electrically conductive, e.g. a polysilicon layer heavily doped with boron, phosphorus, or arsenic.

According to various embodiments the first conductive element 108c of the electrode element 108 may have a thickness in the range from about 500 nm to about 5 µm, e.g. in the range from about 500 nm to about 1 µm, e.g. in the range from about 1 µm to about 2 µm, e.g. in the range from about 2 µm to about 3 µm, e.g. in the range from about 3 µm to about 4 µm, e.g. in the range from about 4 µm to about 5 µm.

According to various embodiments electrical insolation element 108d of the electrode element 108 may include or essentially consist of various dielectric materials, such as, for example, a silicon oxide, silicon nitride, tetraethyl orthosilicate, borophosphosilicate glass, and various plasma oxides. According to various embodiments the electrical insolation element 108d may include or essentially consist of various semiconductor materials such as, silicon dioxide, germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. The electrical insolation element 108d may have a thickness in the range, e.g. from about 100 nm to about 1 µm, e.g. in the range from about 100 nm to about 200 nm, e.g. in the range from about 200 nm to about 500 nm, e.g. in the range from about 500 nm to about 1 µm.

According to various embodiments the second conductive element 108e of the electrode element 108 may include or essentially consist of various metals, e.g. aluminum, silver, copper, nickel, and various alloys such as aluminum-silver and cupronickel.

According to various embodiments the second conductive element 108e of the electrode element 108 may include or essentially consist of various semiconductor materials which may be doped such that they are electrically conductive, e.g. a polysilicon layer heavily doped with boron, phosphorus, or arsenic.

According to various embodiments the second conductive element 108e of the electrode element 108 may have a thickness in the range from about 500 nm to about 5 µm, e.g. in the range from about 500 nm to about 1 µm, e.g. in the range from about 1 µm to about 2 µm, e.g. in the range from about 2 µm to about 3 µm, e.g. in the range from about 3 µm to about 4 µm, e.g. in the range from about 4 µm to about 5 µm.

According to various embodiments, a distance between the top surface 108a of the electrode element 108 and bottom surface 112b of the second electrically conductive layer 112 may be defined as a first sensing gap S1.

According to various embodiment, the first sensing gap S1 may be in the range, e.g. from about 300 nm to about 10 µm, e.g. in the range from about 300 nm to about 400 nm, e.g. in the range from about 400 nm to about 500 nm, e.g. in the range from about 500 nm to about 1 µm, e.g. in the range from about 1 µm to about 3 µm, e.g. in the range from about 3 µm to about 5 µm, e.g. in the range from about 5 µm to about 10 µm.

According to various embodiments, a distance between the bottom surface 108b of the electrode element 108 and a top surface 104a of the first electrically conductive layer 104 may be defined as a second sensing gap S2.

According to various embodiment, the second sensing gap S2 may be in the range, e.g. from about 300 nm to about 10 µm, e.g. in the range from about 300 nm to about 400 nm, e.g. in the range from about 400 nm to about 500 nm, e.g. in the range from about 500 nm to about 1 µm, e.g. in the range from about 1 µm to about 3 µm, e.g. in the range from about 3 µm to about 5 µm, e.g. in the range from about 5 µm to about 10 µm.

According to various embodiments, the first pillar structure 118 may be arranged between the bottom surface 112b of the second electrically conductive layer 112 and the top surface 104a of the first electrically conductive layer 104.

According to various embodiments, the first pillar structure 118 may be formed over the top surface 104a of the first electrically conductive layer 104 through various fabrication techniques, e.g. physical vapor deposition, electrochemical deposition, chemical vapor deposition, and molecular beam epitaxy.

According to various embodiments, the first pillar structure 118 may be arranged the bottom surface 112b of the second electrically conductive layer 112 and the top surface 104a of the first electrically conductive layer 104 to electrically couple the second electrically conductive layer 112 to the first electrically conductive layer 104.

According to various embodiments, the first pillar structure 118 may be arranged between the bottom surface 112b of the second electrically conductive layer 112 and the top surface 104a of the first electrically conductive layer 104 to electrically isolate the second electrically conductive layer 112 from the first electrically conductive layer 104.

According to various embodiments, as illustrated in FIG. 1B, the first pillar structure 118 may have a height, H1, for example in the range from about 1 µm to about 10 µm, e.g. in the range from about 1 µm to about 2 µm, e.g. in the range from about 2 µm to about 2.5 µm, e.g. in the range from about 2.5 µm to about 5 µm, e.g. in the range from about 5 µm to about 7 µm, e.g. in the range from about 7 µm to about 10 µm. According to various embodiments, a thickness T3 of the first pillar structure 208 may be for example, in the range from about 300 nm to about 10 µm, e.g. in the range from about 300 nm to about 400 nm, e.g. in the range from about 400 nm to about 500 nm, e.g. in the range from about 500 nm to about 1 µm, e.g. in the range from about 1 µm to about 3 µm, e.g. in the range from about 3 µm to about 5 µm, e.g. in the range from about 5 µm to about 10 µm.

According to various embodiments, the first pillar structure 118 may be may include or essentially consist of a semiconductor material such as, e.g. silicon. According to various embodiments, the first pillar structure 118 may include or essentially consist of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. According to various embodiments, the first pillar structure 118 may include or essentially consist of at least one of a metal, a dielectric material, a piezoelectric material, a piezoresistive material, and a ferroelectric material.

According to various embodiments, as illustrated in FIGS. 1A to 1C, the first pillar structure 118 may be implemented as a support structure extending between the bottom surface 112b of the second electrically conductive layer 112 and the top surface 104a of the first electrically conductive layer 104. The first pillar structure 118 may be implemented as a plurality of pillars extending between the bottom surface 112b of the second electrically conductive layer 112 and the top surface 104a of the first electrically conductive layer 104. According to various embodiments where the first pillar structure 118 may be implemented as a plurality of pillars 118, each of the individual pillars may be a support structure capable of supporting a portion of the second conductive layer. According to various embodiments, the first pillar structure 118 does not contact and/or touch the electrode element 108, but rather passes through the electrode element 108 via openings or holes 130 which may be formed in the electrode element 108.

According to various embodiments, where the first pillar structure 118 may be implemented as a plurality of pillars, as illustrated in FIGS. 1A to 1C, the spacing, L1, between the pillars 118 may be, for example, in the range from about 1 µm to 50 µm, e.g. in the range from about 1 µm to about 5 µm, e.g. in the range from about 5 µm to about 10 µm, e.g. in the range from about 10 µm to about 20 µm, e.g. in the range from about 20 µm to about 25 µm, e.g. in the range from about 25 µm to about 50 µm.

According to various embodiments, the first pillar structure 118 may be integrally formed with the first and second electrically conductive layers 104 and 112, respectively.

According to various embodiments, the first electrically conductive layer 104, the second electrically conductive layer 112, and the first pillar structure 118 may be an integral structure formed of the same material, e.g. silicon for example.

According to various embodiments, the first electrically conductive layer 104, the second electrically conductive layer 112, and the first pillar structure 118 may each be formed in discrete steps during the manufacturing process of the sensor structure 100.

According to various embodiments, the first pillar structure 118 may include or essentially consist of a different material from that of the first and second electrically conductive layers 104 and 112, respectively.

According to various embodiments, as illustrated in FIG. 1C, electrode element 108 may include an optional encapsulation layer 132 to prevent the first electrically conductive layer 104 and/or the second electrically conductive layer 112 from coming into physical contact with the electrode element 108. The encapsulation layer 132 may include or essentially consist of various dielectrics, such as various dielectric materials, such as, for example, a silicon oxide, silicon nitride, tetraethyl orthosilicate, borophosphosilicate glass, and various plasma oxides. According to various embodiments the encapsulation layer 132 may include or essentially consist of various semiconductor materials such as, silicon dioxide, germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application.

According to various embodiments, as illustrated in FIG. 2A, the void 124 may be arranged in the sensor structure 100 such that the void 124 at least partially separates a portion of the sensor structure 100 which may contain the first chamber 114 from a portion of the sensor structure 100 which may contain the second chamber 116. A distance 202 across the void 124 may be in the range, e.g. from about 1 µm to about 10 µm, e.g. in the range from about 1 µm to about 2 µm, e.g. in the range from about 2 µm to about 3 µm, e.g. in the range from about 3 µm to about 5 µm, e.g. in the range from about 5 µm to about 10 µm. The void 124 may be formed in the sensor structure 100 by means of various techniques, e.g. isotropic gas phase etching, vapor etching, wet etching, isotropic dry etching, plasma etching, laser drilling, various grinding techniques, etc.

According to various embodiments, the a second pillar structure 120 may be arranged in the second chamber 116 between a portion of the second electrically conductive layer 112 and a portion of the electrode element 108. According to various embodiments, the a second pillar structure 120 may be formed over the top surface 108a of the electrode element 108 through various fabrication techniques, e.g. physical vapor deposition, electrochemical deposition, chemical vapor deposition, and molecular beam epitaxy. According to various embodiments, the a second pillar structure 120 may be arranged between the bottom surface 112b of the second electrically conductive layer 112 and the top surface 108a of the electrode element 108 to electrically couple the second electrically conductive layer 112 to the electrode element 108. According to various embodiments, the a second pillar structure 120 may be arranged between the bottom surface 112b of the second electrically conductive layer 112 and the top surface 108a of the electrode element 108 to electrically isolate the second electrically conductive layer 112 from the top surface 108a of the electrode element 108.

According to various embodiments, as illustrated in FIG. 2A, the a second pillar structure 120 may have a height, H2, in the range, for example, from about 1 µm to about 10 µm, e.g. in the range from about 1 µm to about 2 µm, e.g. in the range from about 2 µm to about 2.5 µm, e.g. in the range from about 2.5 µm to about 5 µm, e.g. in the range from about 5 µm to about 7 µm, e.g. in the range from about 7 µm to about 10 µm. According to various embodiments, a thickness T3 of the a second pillar structure 120 may be for example, in the range from about 300 nm to about 10 µm, e.g. in the range from about 300 nm to about 400 nm, e.g. in the range from about 400 nm to about 500 nm, e.g. in the range from about 500 nm to about 1 µm, e.g. in the range from about 1 µm to about 3 µm, e.g. in the range from about 3 µm to about 5 µm, e.g. in the range from about 5 µm to about 10 µm.

According to various embodiments, the a second pillar structure 120 may be may include or essentially consist of a semiconductor material such as, e.g. silicon. The second pillar structure 120 may include or essentially consist of semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. According to various embodiments, the a second pillar structure 120 may include or essentially consist of at least one of a metal, a dielectric material, a piezoelectric material, a piezoresistive material, and a ferroelectric material.

According to various embodiments, the a second pillar structure 120 may be implemented as a plurality of pillars extending between the bottom surface 112b of the second electrically conductive layer 112 and the top surface 108a of the electrode element 108. In various embodiments where the a second pillar structure 120 may be implemented as a plurality of pillars, the spacing, L2, between the pillars 120 may be, for example, in the range from about 1 µm to 50 µm, e.g. in the range from about 1 µm to about 5 µm, e.g. in the range from about 5 µm to about 10 µm, e.g. in the range from about 10 µm to about 20 µm, e.g. in the range from about 20 µm to about 25 µm, e.g. in the range from about 25 µm to about 50 µm.

According to various embodiments, the a second pillar structure 120 may be integrally formed with the second electrically conductive layer 112.

According to various embodiments, the second electrically conductive layer 112, the a second pillar structure 120, and the electrode element 108 may be an integral structure formed of the same material, e.g. silicon for example.

According to various embodiments, the second electrically conductive layer 112, the second pillar structure 120, and the electrode element 108 may each be formed in discrete steps during the manufacturing process of the sensor structure 100 and may all be different materials.

According to various embodiments, the sensor structure 100 may be manufactured by the exemplary process as illustrated in FIGS. 4 to 17. The portions of the sensor structure 100 which may contain the pressure wave magnitude sensing structure and the ambient pressure sensing structure, respectively, may be manufactured by the exemplary process illustrated in FIGS. 4 to 17. According to various embodiments, a portion of the sensor structure 100 which may be capable of sensing a magnitude of an incident pressure wave, may be manufactured by the exemplary process as illustrated in FIGS. 5 to 10. A portion of the sensor structure 100 which may be capable of sensing a change in ambient pressure may be manufactured by the exemplary process as illustrated in FIGS. 11 to 17.

Figure 4A:
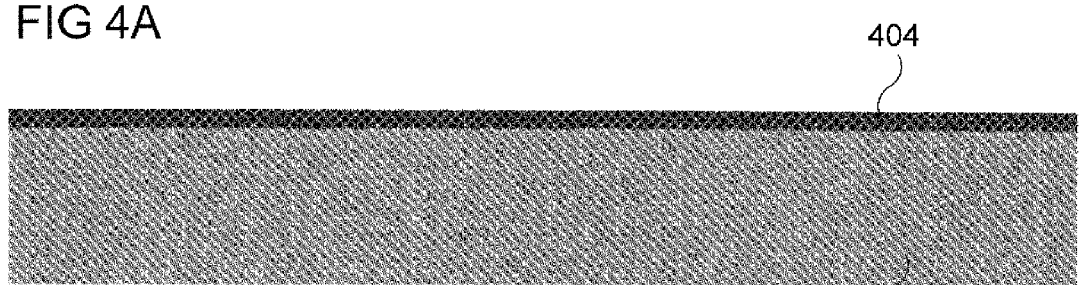
FIGS. 4A to 4D graphically illustrate an exemplary method for forming the sensor structure from FIG. 2A according to various embodiments.

The process may include, as illustrated in FIG. 4A, providing a substrate 402 and forming an etch stop layer 404 on a surface of the substrate 402.

According to various embodiments, the substrate 402 may include or essentially consist of a semiconductor material such as, e.g. silicon. According to various embodiments, the substrate 402 may include or essentially consist of semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. The substrate 402 may include or essentially consist of other materials or combinations of material, for example various dielectrics, metals, and polymers as are desirable for a given application. According to various embodiments, the substrate 402 may include or essentially consist of, for example, glass, and/or various polymers. The substrate 402 may be a silicon-on-insulator (SOI) structure. According to various embodiments, the substrate 402 may be a printed circuit board.

According to various embodiments, the etch stop layer 404 may be an oxide layer, e.g. a silicon oxide layer. The etch stop layer 404 may include or essentially consist of various other dielectrics, such as, for example, silicon nitride, tetraethyl orthosilicate, borophosphosilicate glass, and various plasma oxides. According to various embodiments, the etch stop layer 404 may have a thickness in the range, e.g. from about 100 nm to about 1 µm, e.g. in the range from about 100 nm to about 200 nm, e.g. in the range from about 200 nm to about 500 nm, e.g. in the range from about 500 nm to about 1 µm.

Figure 4B:
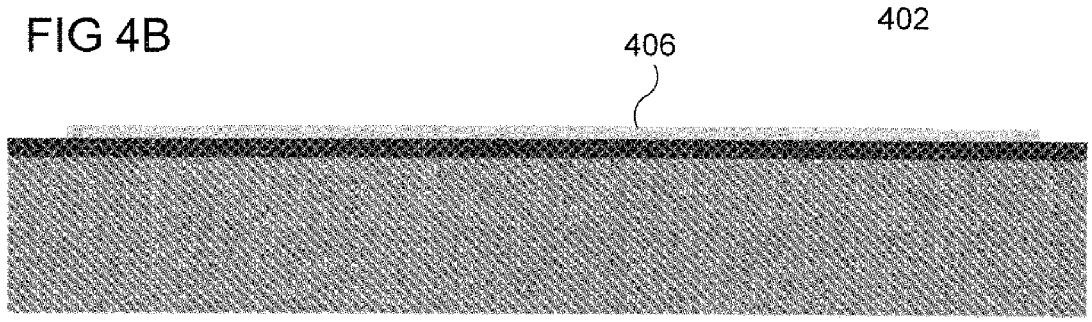

As illustrated in FIG. 4B, the manufacturing process of the sensor structure 100 in accordance with various embodiments may further include forming a first conductive layer 406 over a surface of the etch stop layer 404. The first conductive layer 406 may include or essentially consist of a semiconductor material that has been doped so that is conductive, e.g. a doped polysilicon layer. According to various embodiments, the first conductive layer 406 may include or essentially consist of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. The first conductive layer 406 may include or essentially consist of other materials or combinations of material, for example various metals and polymers as may be desirable for a given application. The first conductive layer 406 may have a thickness in the range, e.g. from about 100 nm to about 2 µm, e.g. in the range from about 100 nm to about 200 nm, e.g. in the range from about 200 nm to about 500 nm, e.g. in the range from about 500 nm to about 1 µm, e.g. in the range from about 1 µm to about 2 µm.

Figure 4C:
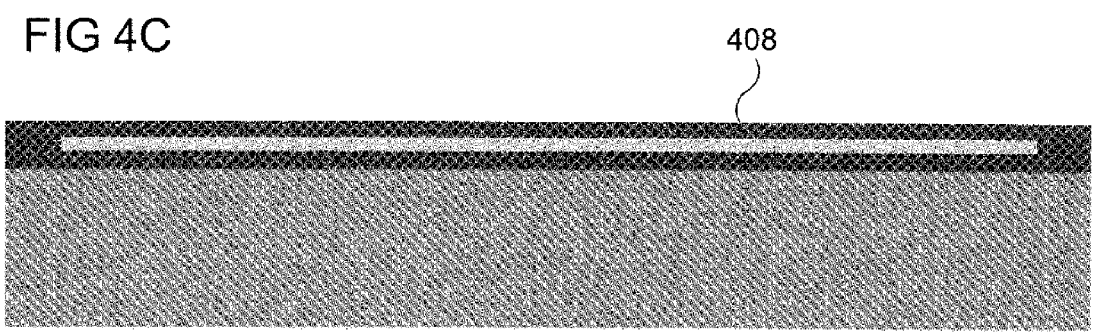

As illustrated in FIG. 4C, the manufacturing process of the sensor structure 100 in accordance with various embodiments may further include forming a sacrificial layer 408 over a surface the first conductive layer 406 and a surface of the etch stop layer 404. According to various embodiments, the sacrificial layer 408 and the etch stop layer 404 may substantially encapsulate the first conductive layer 406. According to various embodiments, sacrificial layer 408 may be an oxide layer, e.g. a silicon oxide layer. The sacrificial layer 408 may include or essentially consist of various other dielectrics, such as, for example, silicon nitride, tetraethyl orthosilicate, borophosphosilicate glass, and various plasma oxides. The sacrificial layer 408 and the etch stop layer 404 may include or essentially consist of the same material. According to various embodiments, the sacrificial layer 408 may have a thickness in the range, e.g. from about 100 nm to about 5 µm, e.g. in the range from about 100 nm to about 200 nm, e.g. in the range from about 200 nm to about 500 nm, e.g. in the range from about 500 nm to about 1 µm, e.g. in the range from about 1 µm to about 3 µm, e.g. in the range from about 3 µm to about 5 µm.

Figure 4D:
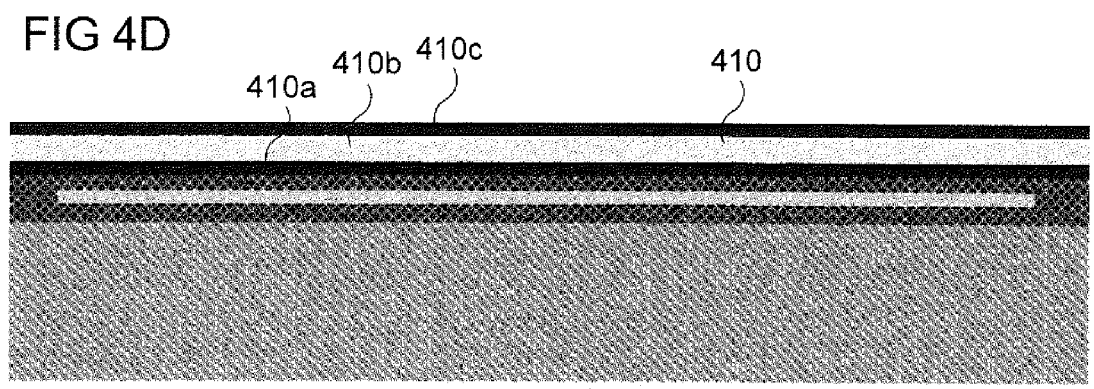

As illustrated in FIG. 4D, the manufacturing process of the sensor structure 100 in accordance with various embodiments may further include forming a multilayer electrode element 410 over a surface of the sacrificial layer 408. According to various embodiments, the multilayer electrode element 410 may include a first conductor layer 410a, an isolation layer 410b, and a second conductor layer 410c. According to various embodiments, the first conductor layer 410a and a second conductor layer 410c may include or essentially consist of the same conductive material. According to various embodiments, the first conductor layer 410a and a second conductor layer 410c may include or essentially consist of different conductive materials.

According to various embodiments, the first conductor layer 410a may include or essentially consist of a semiconductor material that has been doped so that is conductive, e.g. a doped polysilicon layer. According to various embodiments, the first conductor layer 410a may include or essentially consist of composed of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. The first conductor layer 410a may include or essentially consist of other materials or combinations of material, for example various metals and polymers as may be desirable for a given application. The first conductor layer 410a may have a thickness in the range, e.g. from about 100 nm to about 1 μm, e.g. in the range from about 100 nm to about 200 nm, e.g. in the range from about 200 nm to about 500 nm, e.g. in the range from about 500 nm to about 1 μm.

According to various embodiments, the isolation layer 410b may include or essentially consist of various semiconductor materials such as, silicon nitride, silicon dioxide, germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. The isolation layer 410b may have a thickness in the range, e.g. from about 100 nm to about 1 μm, e.g. in the range from about 100 nm to about 200 nm, e.g. in the range from about 200 nm to about 500 nm, e.g. in the range from about 500 nm to about 1 μm.

According to various embodiments, the second conductor layer 410c may include or essentially consist of a semiconductor material that has been doped so that is conductive, e.g. a doped polysilicon layer. According to various embodiments, the second conductor layer 410c may include or essentially consist of other semiconductor materials such as germanium, silicon germanium, silicon carbide, gallium nitride, indium, indium gallium nitride, indium gallium arsenide, indium gallium zinc oxide, and other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as may be desired for a given application. The second conductor layer 410c may include or essentially consist of other materials or combinations of material, for example various metals and polymers as may be desirable for a given application. The second conductor layer 410c may have a thickness in the range, e.g. from about 100 nm to about 1 μm, e.g. in the range from about 100 nm to about 200 nm, e.g. in the range from about 200 nm to about 500 nm, e.g. in the range from about 500 nm to about 1 μm.

According to various embodiments, a portion of the sensor structure 100 which may be capable of sensing a magnitude of an incident pressure wave may be manufactured by the process described below and as illustrated in FIGS. 5 to 10.

Figure 5A:
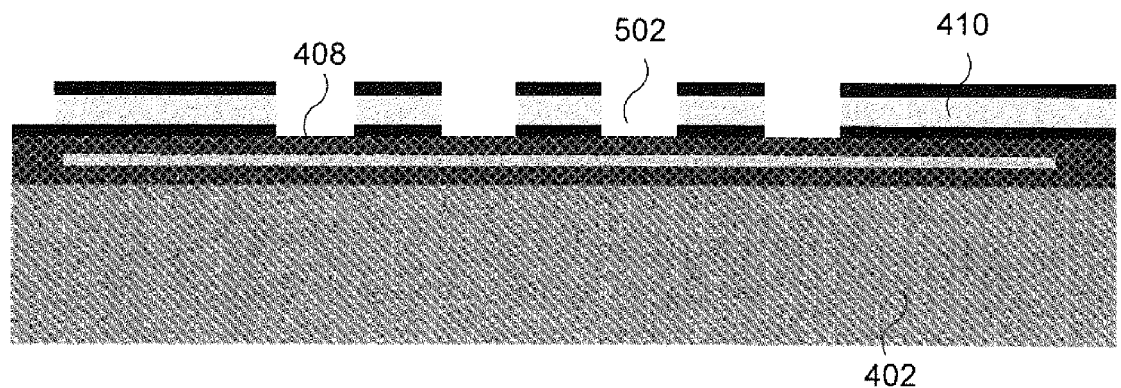
FIGS. 5A and 5B illustrate potential further steps in the exemplary method for forming the sensor structure from FIG. 2A.

According to various embodiments, as illustrated in FIG. 5A, the manufacturing process of the sensor structure 100 in accordance with various embodiments may further include structuring the multilayer electrode element 410 by means of various etching techniques, e.g. isotropic gas phase etching, vapor etching, wet etching, isotropic dry etching, plasma etching, etc. According to various embodiments, the multilayer electrode element 410 may be structured such that at least one void 502 may be formed in the multilayer electrode element 410 such that at least a portion of the sacrificial layer 408 is exposed.

Figure 5B:
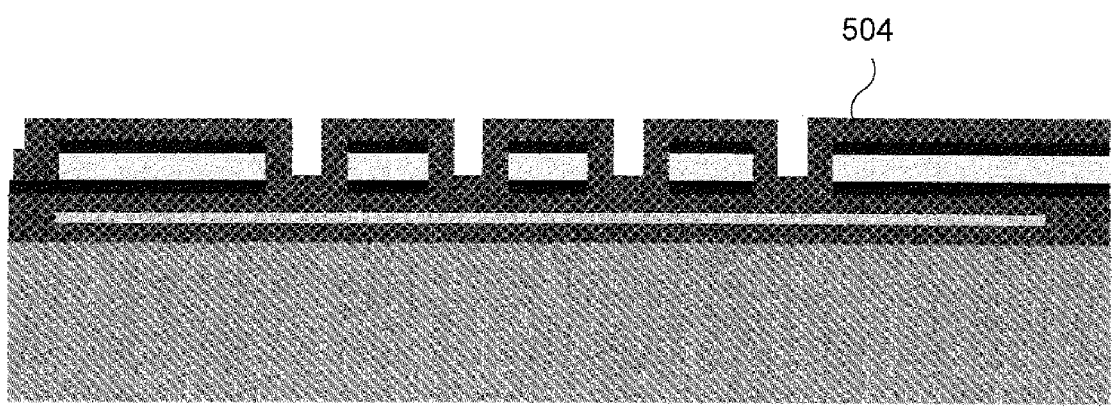

As illustrated in FIG. 5B, the manufacturing process of the sensor structure 100 in accordance with various embodiments may further include forming a capping layer 504 over the multilayer electrode element 410 and the portion of the sacrificial layer 408 exposed by the formation of the at least one void 502. The capping layer 504 may be an oxide layer, e.g. a silicon oxide layer. The capping layer 504 may be composed of or may include various dielectrics, such as, for example, silicon nitride, tetraethyl orthosilicate, borophosphosilicate glass, and various plasma oxides. The capping layer 504, the sacrificial layer 408 and the etch stop layer 404 may include or essentially consist of the same material. According to various embodiments, the capping layer 504 may have a thickness in the range, e.g. from about 100 nm to about 5 μm, e.g. in the range from about 100 nm to about 200 nm, e.g. in the range from about 200 nm to about 500 nm, e.g. in the range from about 500 nm to about 1 μm, e.g. in the range from about 1 μm to about 3 μm, e.g. in the range from about 3 μm to about 5 μm.

Figure 6A:
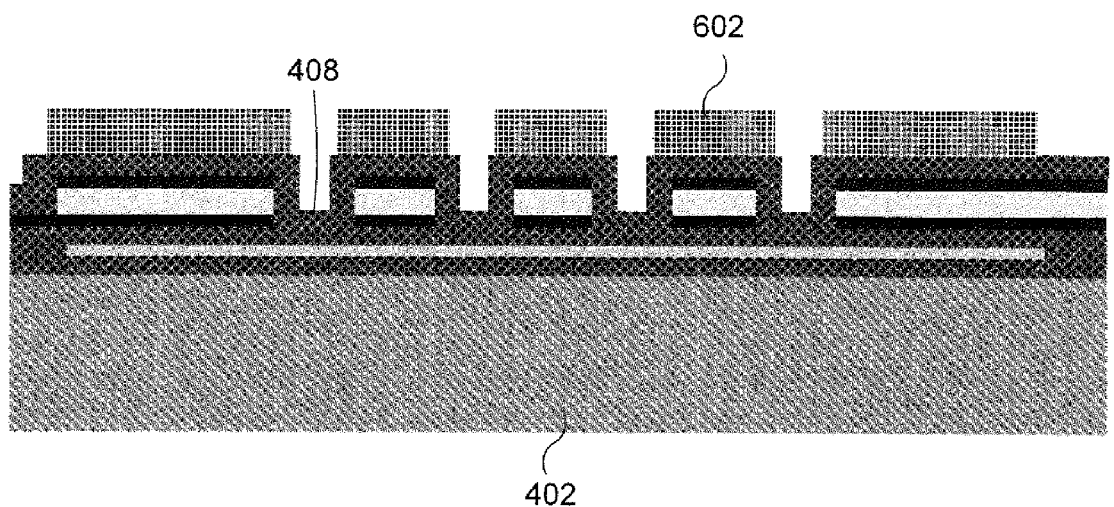
FIGS. 6A and 6B illustrate additional potential structuring steps in the exemplary method for forming the sensor structure from FIG. 2A.

According to various embodiments, the manufacturing process of the sensor structure 100 in accordance with various embodiments may further include, as illustrated in FIG. 6A, forming a masking layer 602. According to various embodiments, the masking layer 602 may only cover the portion of the capping layer 504 which is not disposed in and/or over the at least one void 502. The masking layer 602 may include or essentially consist of, e.g. photoresist.

Figure 6B:
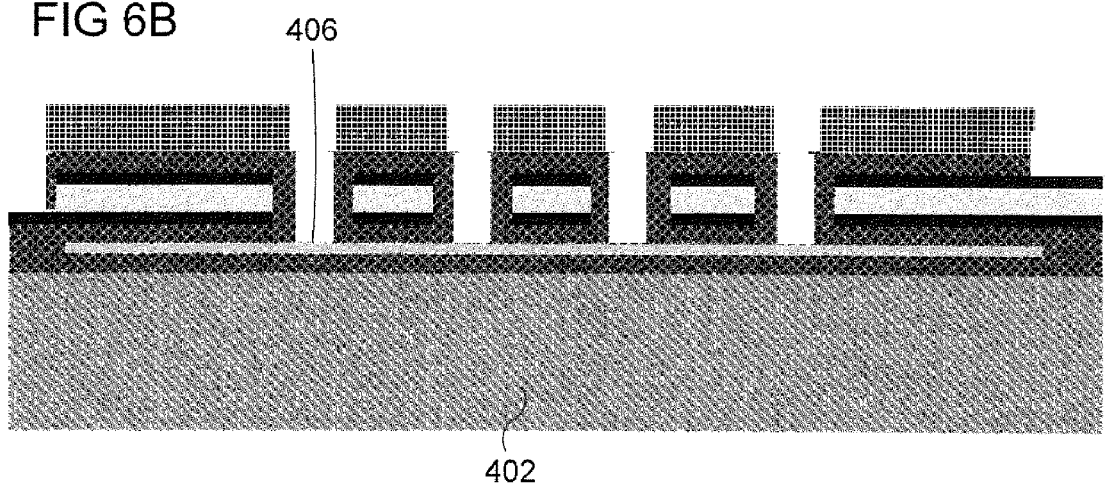
Figure 7A:
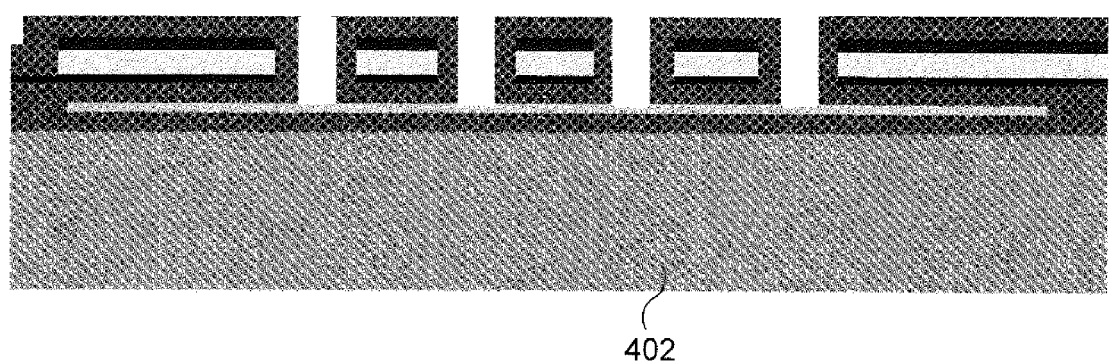
FIGS. 7A and 7B illustrate further structuring and/or layer deposition steps in the exemplary method for forming the sensor structure from FIG. 2A.

The manufacturing process of the sensor structure 100 in accordance with various embodiments may further include, as illustrated in FIG. 6B, structuring the sacrificial layer 408 such that the portion of the sacrificial layer 408 which may be disposed in and/or over the at least one void 502 may be removed. In other words, the sacrificial layer 408 may be structured such that the first conductive layer 406 is exposed by the structuring process. The portion of the sacrificial layer 408 which may be removed in the structuring process may be removed by means of various techniques, e.g. isotropic gas phase etching, vapor etching, wet etching, isotropic dry etching, plasma etching, laser drilling, various grinding techniques, etc. The exemplary manufacturing process of the sensor structure 100 in accordance with various embodiments may further include, as illustrated in FIG. 7A, removing the masking layer 602.

Figure 7B:
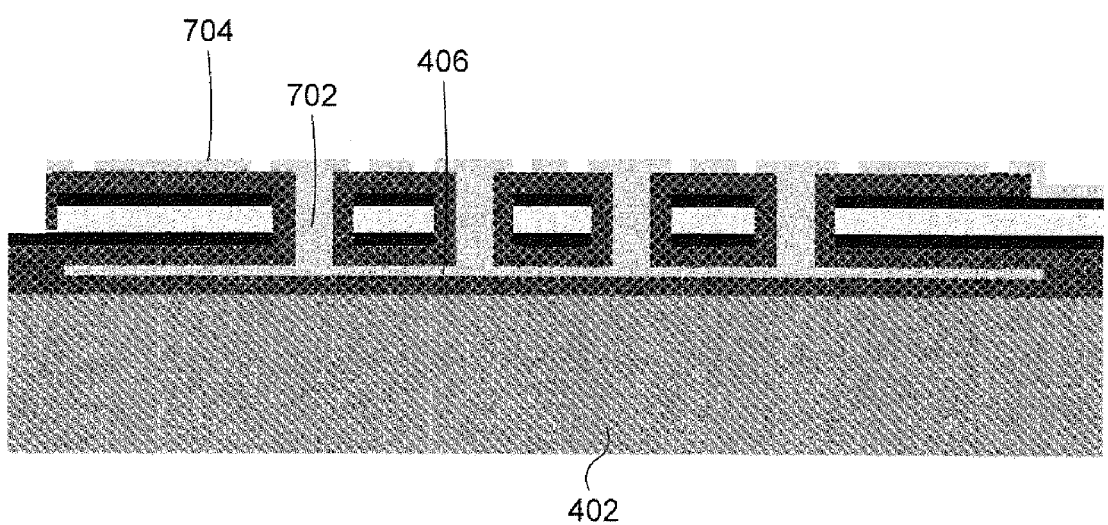

The manufacturing process of the sensor structure 100 in accordance with various embodiments may further include, as illustrated in FIG. 7B, forming a first pillar structure 702 and a second conductive layer 704. According to various embodiments, the first pillar structure 702 may include or essentially consist of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. According to various embodiments, the first pillar structure 702 may be composed of or may include at least one of a metal, a dielectric material, a piezoelectric material, a piezoresistive material, and a ferroelectric material. The first pillar structure 702 may be arranged to electrically couple the first conductive layer 406 to the second conductive layer 704. According to various embodiments, the first pillar structure 702 may be arranged to electrically isolate the first conductive layer 406 from the second conductive layer 704. According to various embodiments, the first pillar structure 702 may be integrally formed with the second conductive layer 704. According to various embodiments, the first pillar structure 702 and the second conductive layer 704 may be formed in discrete processes.

Figure 8A:
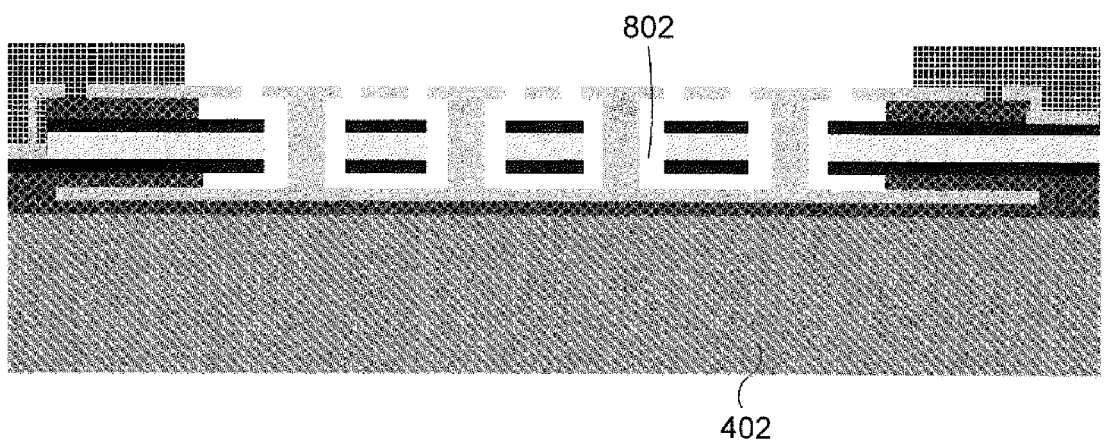
FIGS. 8A and 8B illustrate potential structuring steps in the exemplary method for forming the sensor structure from FIG. 2A.
Figure 8B:
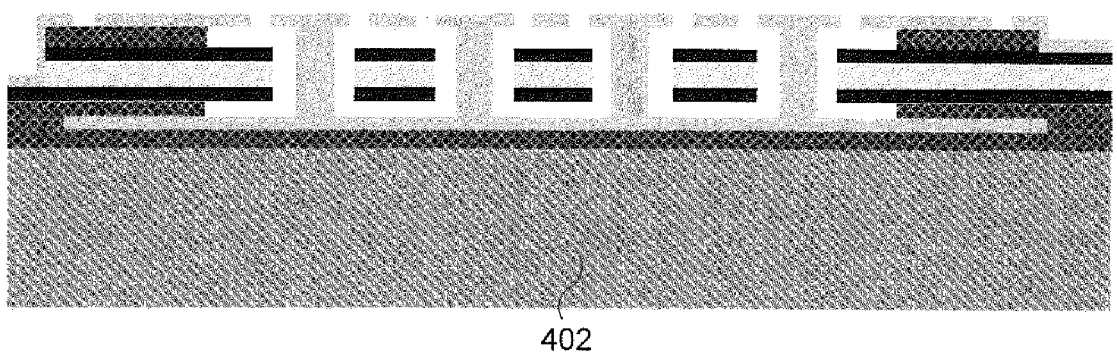

The manufacturing process of the sensor structure 100 in accordance with various embodiments may further include, as illustrated in FIGS. 8A and 8B, removing at least a portion of the capping layer 504 and at least a portion of the sacrificial layer 408. A portion of the sacrificial layer 408 may be removed from around the multilayer electrode element 410 such that at least a portion of the multilayer electrode element 410 may become suspended above and/or over a portion of the first conductive layer 406. At least a portion of the capping layer 504 may be removed from the vicinity of the first pillar structure 702 such that at least a portion of the first pillar structure 702 may become substantially freestanding. Removing at least a portion of the capping layer 504 may cause a portion of the second conductive layer 704 to become suspended above and/or over a portion of the multilayer electrode element 410. According to various embodiments, removing at least a portion of the capping layer 504 may define a first chamber 802 enclosed by the first conductive layer 406, the second conductive layer 704, the multilayer electrode element 410, the sacrificial layer 408, and the capping layer 504. The first chamber 802 may be intersected and/or at least partially subdivided by the first pillar structure 702 and the multilayer electrode element 410.

Figure 9A:
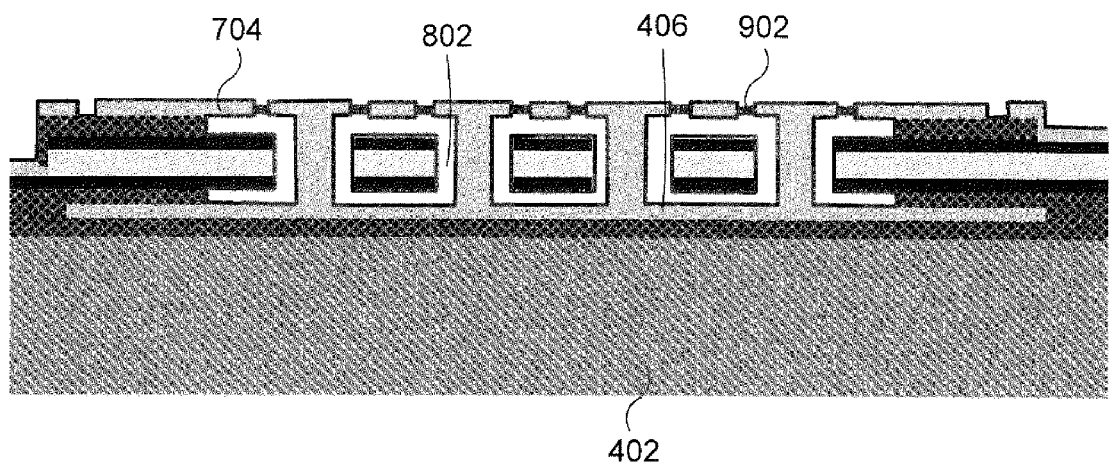
FIGS. 9A and 9B a potential metallization steps in the exemplary method for forming the sensor structure from FIG. 2A.
Figure 9B:
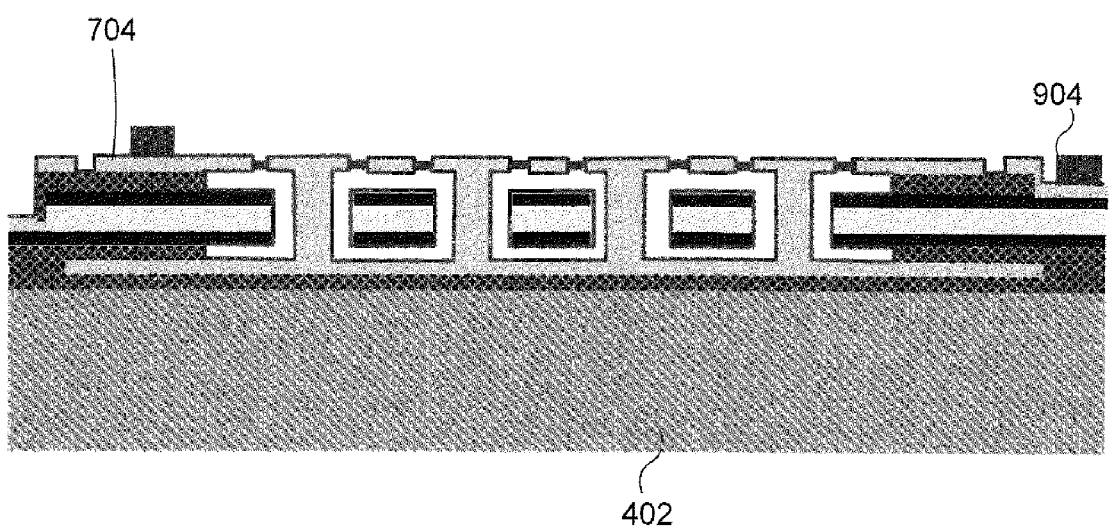

The manufacturing process of the sensor structure 100 in accordance with various embodiments may further include, as illustrated in FIGS. 9A and 9B, forming a metal layer 902 over at least a portion of the first conductive layer 406, the second conductive layer 704, the multilayer electrode element 410, and the first pillar structure 702. The metal layer 902 may at least partially encapsulate the multilayer electrode element 410. According to various embodiments, the metal layer 902 may be formed over at least a portion of the surface of the first chamber 802. The metal layer 902 may include or essentially consist of various metals, e.g. aluminum, silver, copper, nickel, and various alloys such as aluminum-silver and cupronickel.

The manufacturing process of the sensor structure 100 in accordance with various embodiments may further include, as illustrated in FIG. 9B, forming at least one contact pad 904. The at least one contact pad 904 may be formed over at least a portion of a surface of the second conductive layer 704. According to various embodiments, the at least one contact pad 904 may be arranged such that it is electrically coupled to the second conductive layer 704. The at least one contact pad 904 may include or essentially consist of various metals, e.g. aluminum, silver, copper, nickel, and various alloys such as aluminum-silver and cupronickel. According to various embodiments, the at least one contact pad 904 may be formed over a surface of the second conductive layer 704 by means of various fabrication techniques, e.g. physical vapor deposition, electrochemical deposition, chemical vapor deposition, electroplating, electroless plating, molecular beam epitaxy and various other fabrication techniques as may be desirable for a given application.

Figure 10:
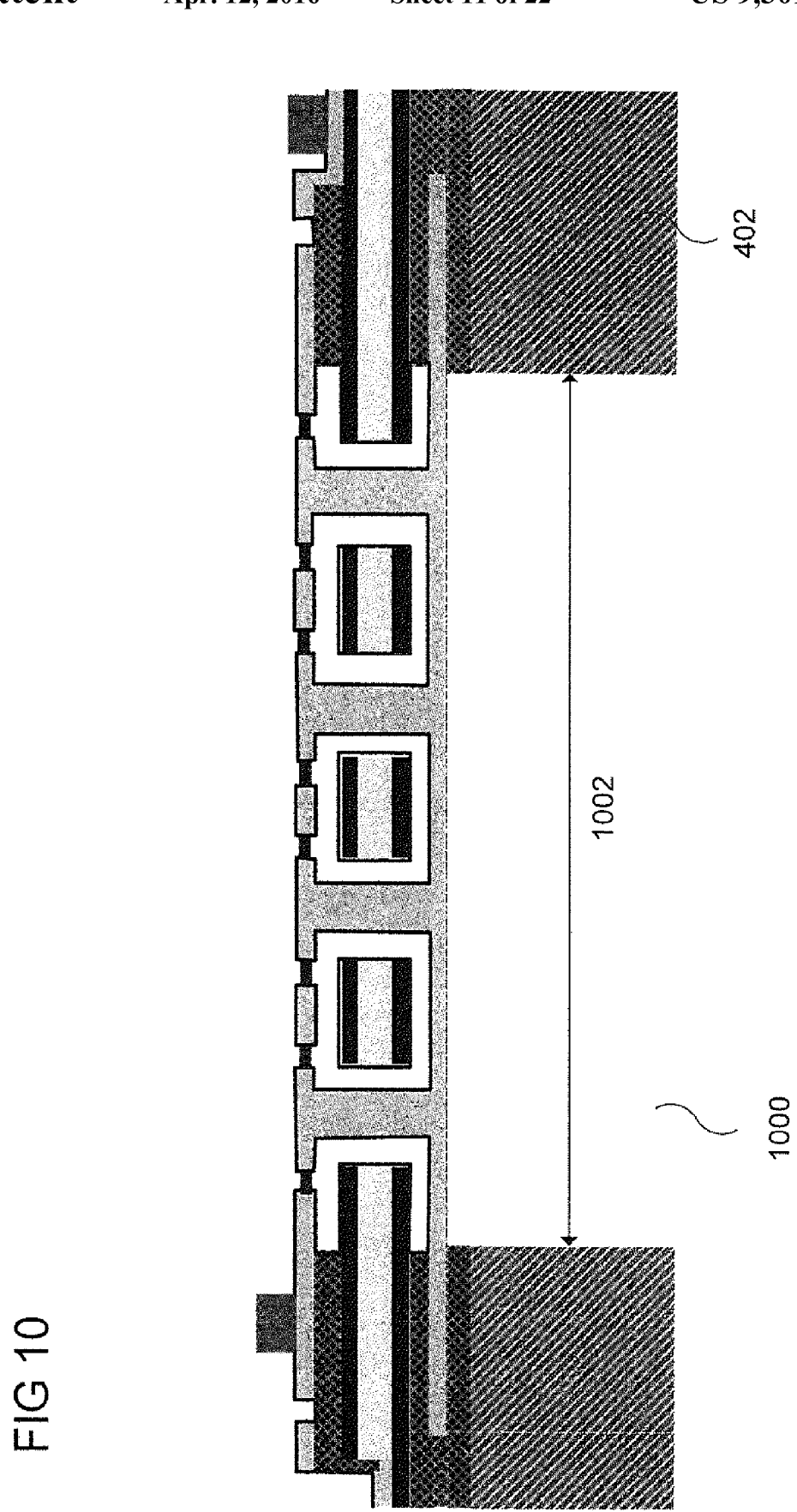
FIG. 10 illustrates a potential structuring step in the exemplary method for forming the sensor structure from FIG. 2A.

According to various embodiments, as illustrated in FIG. 10, a cavity 1000 may be formed in the substrate 402. The cavity 1000 may be formed by removing a portion of the substrate 402 such that a portion of the first conductive layer 406 may become suspended across the cavity 1000. According to various embodiments, the cavity 1000 may be formed by means of various techniques, e.g. isotropic gas phase etching, vapor etching, wet etching, isotropic dry etching, plasma etching, laser drilling, and various grinding techniques. According to various embodiments, a distance 1002 which may span the cavity 1002 may be, for example, in the range from about 0.5 mm to about 5 mm, e.g. in the range from about 0.5 mm to about 1 mm, e.g. in the range from about 1 mm to about 1.5 mm, e.g. in the range from about 1.5 mm to about 2 mm, e.g. in the range from about 2 mm to about 2.5 mm, e.g. in the range from about 2.5 mm to about 3 mm, e.g. in the range from about 3 mm to about 5 mm.

According to various embodiments, a portion of the sensor structure 100 which may be capable of sensing a change in ambient pressure may be manufactured by following the process as described below and as illustrated in FIGS. 11 to 17.

Figure 11A:
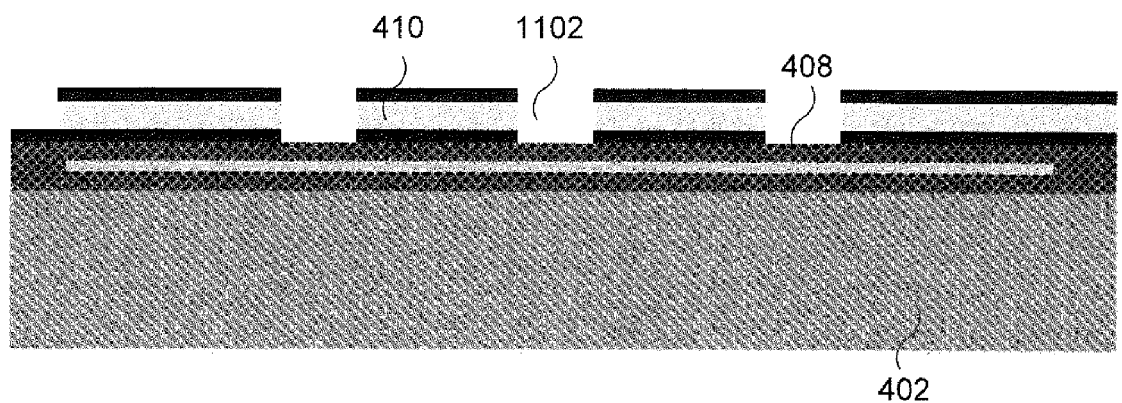
FIGS. 11A and 11B illustrate potential structuring steps in the exemplary method for forming the sensor structure from FIG. 2A.

According to various embodiments, as illustrated in FIG. 11A, at least a second void 1102 may be formed in the multilayer electrode element 410 such that at least a portion of the sacrificial layer 408 is exposed. The same process as described above for forming the least one void 502 in the multilayer electrode element 410 may be employed to form the at least a second void 1102. According to various embodiments, the at least one void 502 and the at least one second void 1102 may differ primarily in their size, shape, and/or respective location on the sensor structure 100.

Figure 11B:
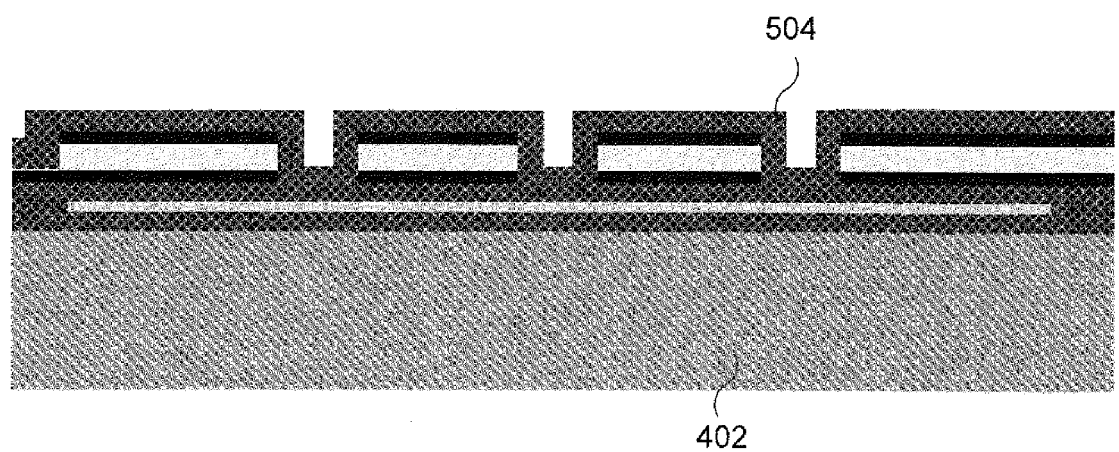

According to various embodiments, as illustrated in FIG. 11B, the capping layer 504, as described in detail above, may extend over the portion of the sacrificial layer 408 exposed by the formation of the at least a second void 1102.

Figure 12A:
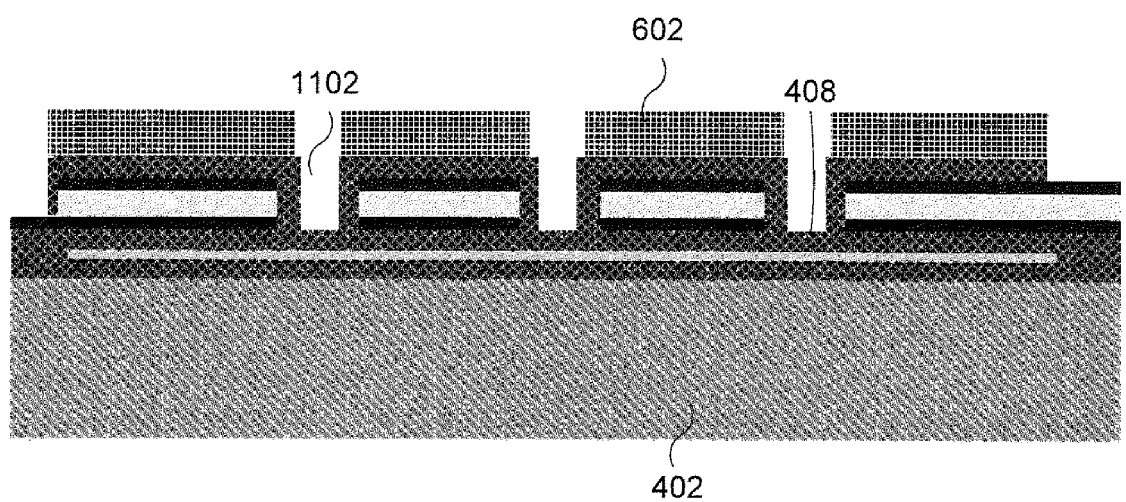
FIGS. 12A and 12B illustrate potential structuring steps in the exemplary method for forming the sensor structure from FIG. 2A.

According to various embodiments, as illustrated in FIG. 12A, the masking layer 602, as described in detail above, may cover a portion of the capping layer 504 which is not disposed in and/or over the at least a second void 1102.

Figure 12B:
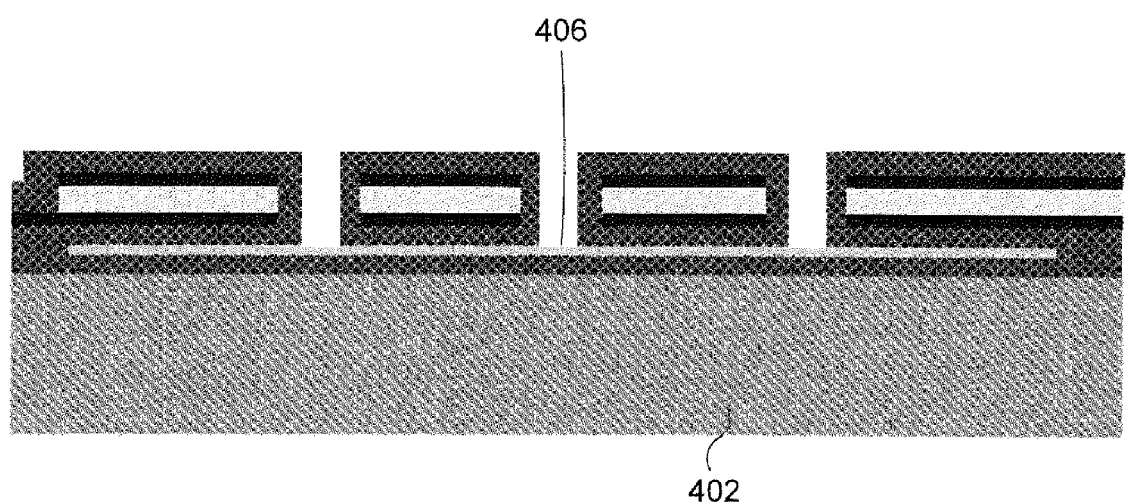

The manufacturing process of the sensor structure 100 in accordance with various embodiments may further include, as illustrated in FIG. 12B, structuring the sacrificial layer 408 such that the portion of the sacrificial layer 408 which may be disposed in and/or over the at least a second void 1102 may be removed. In other words, the sacrificial layer 408 may be structured such that the first conductive layer 406 is exposed by the structuring process. The portion of the sacrificial layer 408 which may be removed in the structuring process may be removed by means of various techniques, e.g. isotropic gas phase etching, vapor etching, wet etching, isotropic dry etching, plasma etching, laser drilling, various grinding techniques, etc. The manufacturing process of the sensor structure 100 in accordance with various embodiments may further include removing the masking layer 602.

Figure 13A:
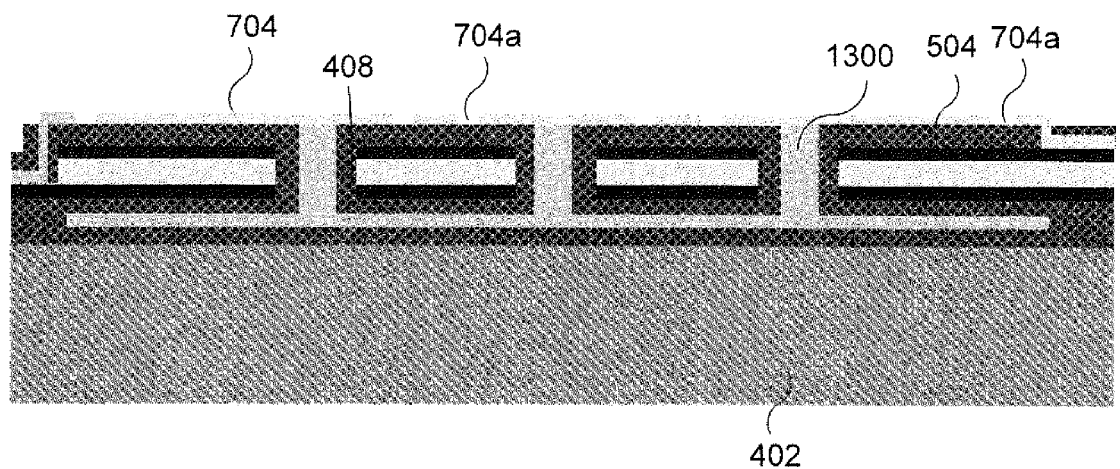
FIGS. 13A and 13B illustrate potential structuring steps in the exemplary method for forming the sensor structure from FIG. 2A.

The manufacturing process of the sensor structure 100 in accordance with various embodiments may further include, as illustrated in FIG. 13A, forming a second pillar structure 1300. According to various embodiments, the manufacturing process of the sensor structure 100 may further include, as illustrated in FIG. 13A, forming a second pillar structure 1300. According to various embodiments, the a second pillar structure 1300 may be substantially identical to the a second pillar structure 120 and may be formed by means of the processes described in detail above. According to various embodiments, the manufacturing process of the sensor structure 100 may further include forming the second conductive layer 704 over at least a portion of the a second pillar structure 1300. According to various embodiments, several etch holes 704a, may be formed in the second conductive layer 704. The second conductive layer 704 may be substantially identical to the second electrically conductive layer 112 and may be formed through the processes described in detail above.

Figure 13B:
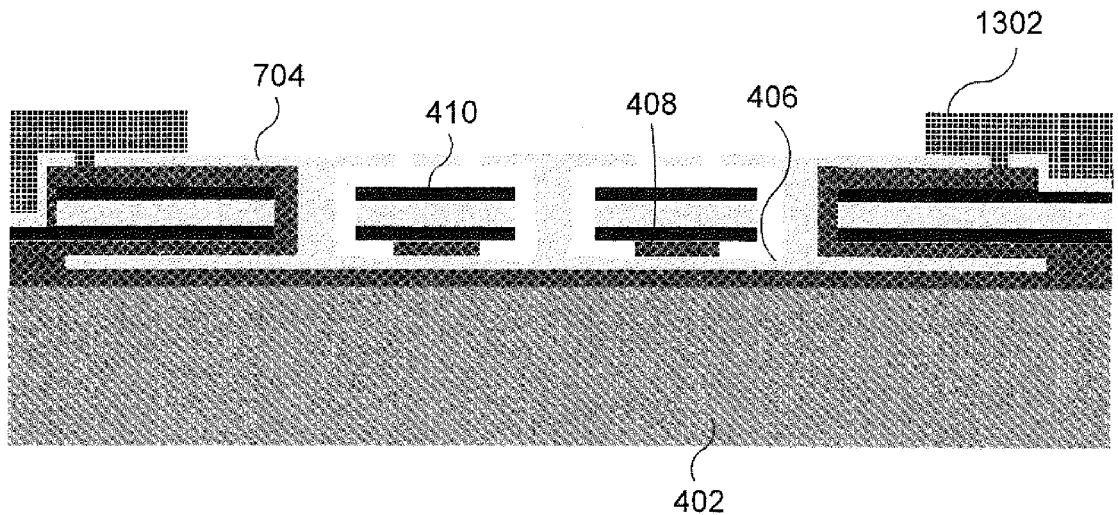

According to various embodiments, the manufacturing process of the sensor structure 100 may further include, as illustrated in FIG. 13B, forming a masking layer 1302 over at least a portion of the second conductive layer 704. The masking layer 1302 may be arranged at an edge portion of the second conductive layer 704. The masking layer 1302 may be arranged on the second conductive layer 704 such that the etch holes 704a are not covered by the masking layer 1302. According to various embodiments, the masking layer 1302 may include or essentially consist of e.g. photoresist.

Figure 14A:
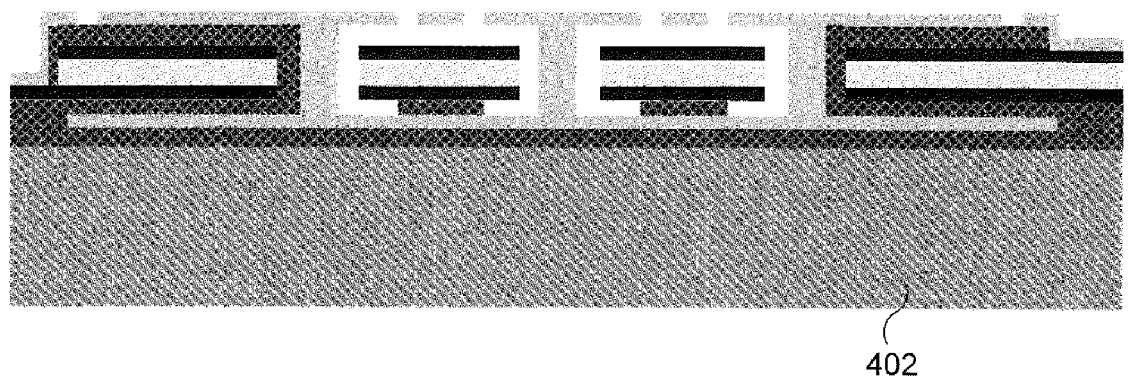
FIGS. 14A and 14B illustrate potential structuring steps in the exemplary method for forming the sensor structure from FIG. 2A.

According to various embodiments, the manufacturing process of the sensor structure 100 may further include, as illustrated in FIG. 13B, structuring the sacrificial layer 408 and the capping layer 504 such that a portion of the second conductive layer 704 becomes suspended above at least a portion of the multilayer electrode element 410. Structuring the sacrificial layer 408 and the capping layer 504 may expose at least a portion of the first conductive layer 406. According to various embodiments, structuring the sacrificial layer 408 and the capping layer 504 may cause a portion of the multilayer electrode element 410 to become suspended above the first conductive layer 406. The portion of the multilayer electrode element 410 which may be suspended above the first conductive layer 406 may be supported by a portion of the sacrificial layer 408. According to various embodiments, the manufacturing process of the sensor structure 100 may further include, as illustrated in FIG. 14A, removing the masking layer 1302.

Figure 14B:
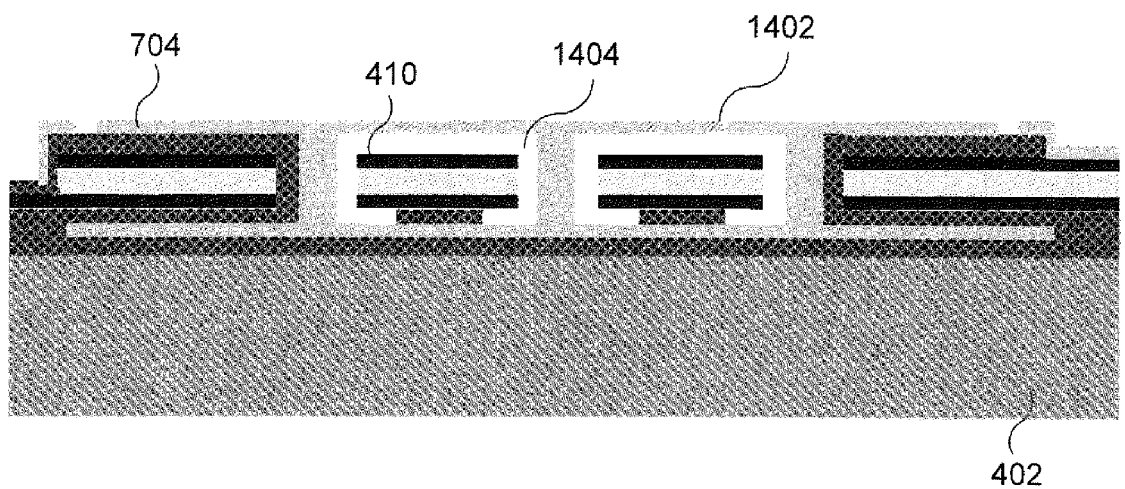

According to various embodiments, the manufacturing process of the sensor structure 100 may further include, as illustrated in FIG. 14B, forming a metal layer 1402 over at least a portion of the second conductive layer 704. The metal layer 1402 may be arranged in at least one of the several etch holes 704a. According to various embodiments, arranging the metal layer 1402 in at least one of the several etch holes 704a may create at least one enclosed chamber 1404 around a portion of the multilayer electrode element 410. The metal layer 1402 may be composed of or may include various metals, e.g. aluminum, silver, copper, nickel, and various alloys such as aluminum-silver and cupronickel.

Figure 15A:
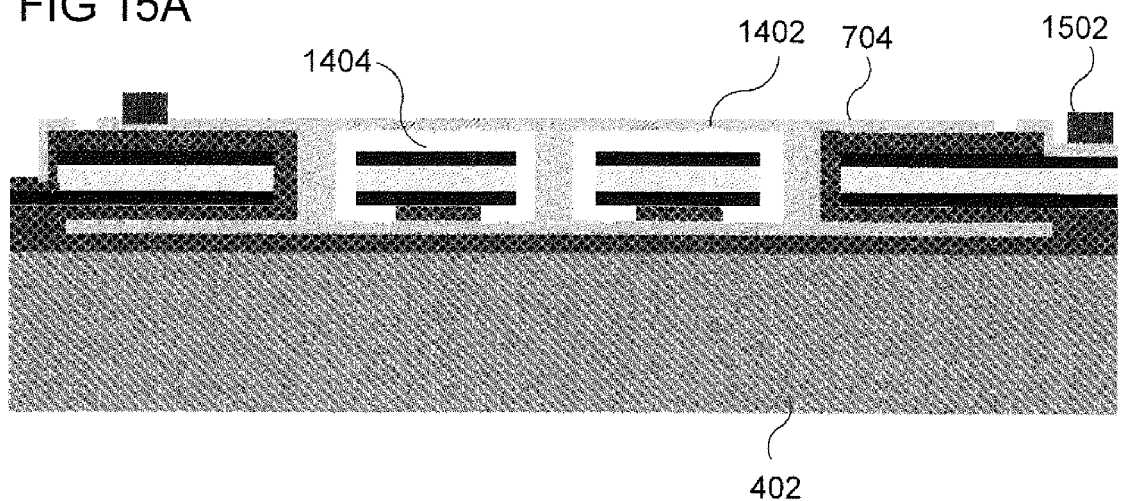
FIGS. 15A and 15B further illustrate potential structuring steps in the exemplary method for forming the sensor structure from FIG. 2A.

According to various embodiments, the manufacturing process of the sensor structure 100 may further include, as illustrated in FIG. 15A, forming at least one contact pad 1502. The at least one contact pad 1502 may be formed over at least a portion of a surface of the second conductive layer 704. According to various embodiments, the at least one contact pad 1502 may be arranged such that it is electrically coupled to the second conductive layer 704. The at least one contact pad 1502 may include or essentially consist of various metals, e.g. aluminum, silver, copper, nickel, and various alloys such as aluminum-silver and cupronickel. According to various embodiments, the at least one contact pad 1502 may be formed over a surface of the second conductive layer 704 by means of various fabrication techniques, e.g. physical vapor deposition, electrochemical deposition, chemical vapor deposition, electroplating, electroless plating, molecular beam epitaxy and various other fabrication techniques as may be desirable for a given application.

Figure 15B:
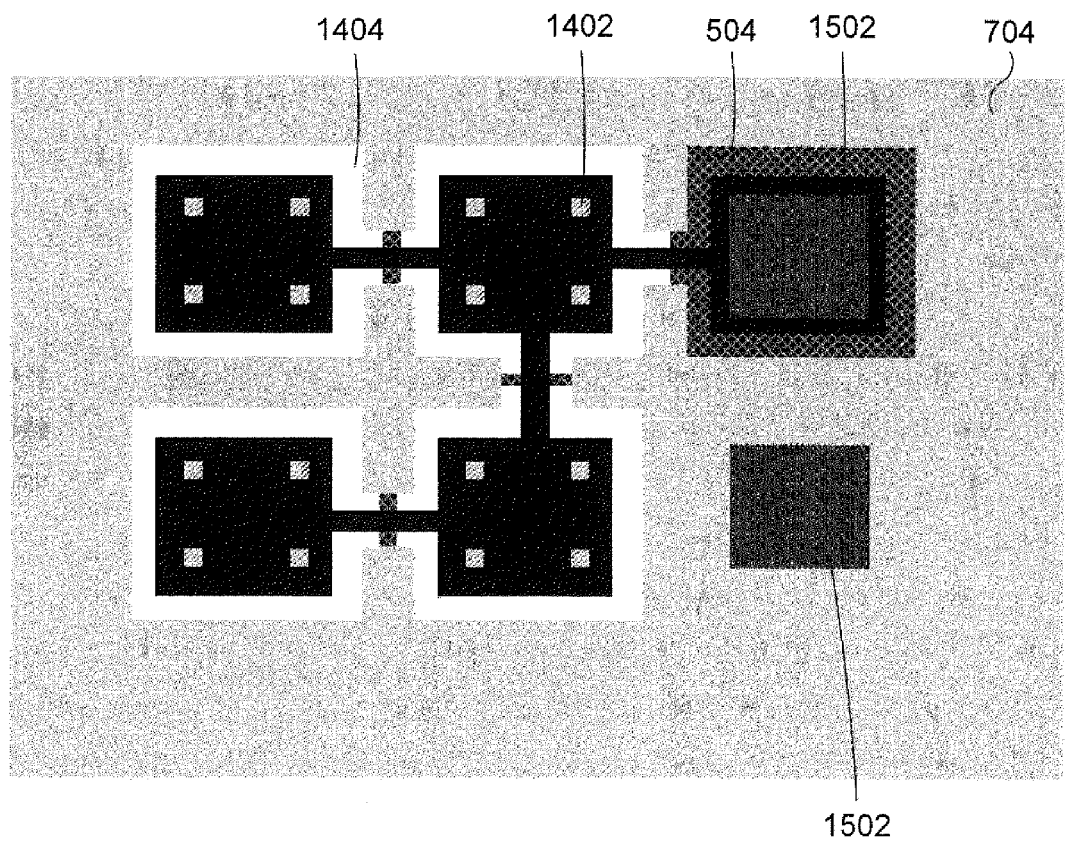

FIG. 15B shows an overhead view, according to various embodiments, of the sensor structure 100 manufactured through the above-described process and as illustrated in FIGS. 4 to 15A.

Figure 16A:
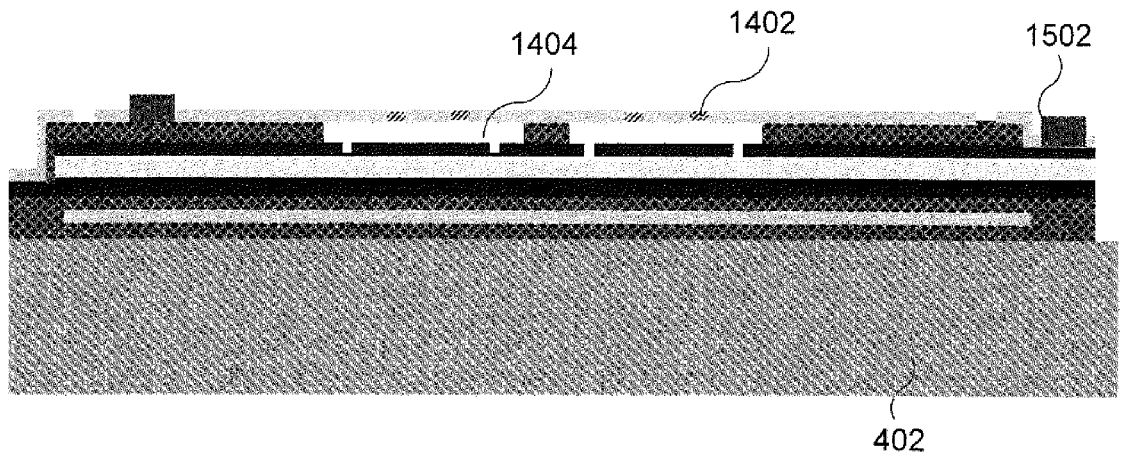
FIGS. 16A and 16B show cross-sectional and overhead perspective views of a potential embodiment of the sensor structure shown in FIGS. 4 to 15.
Figure 16B:
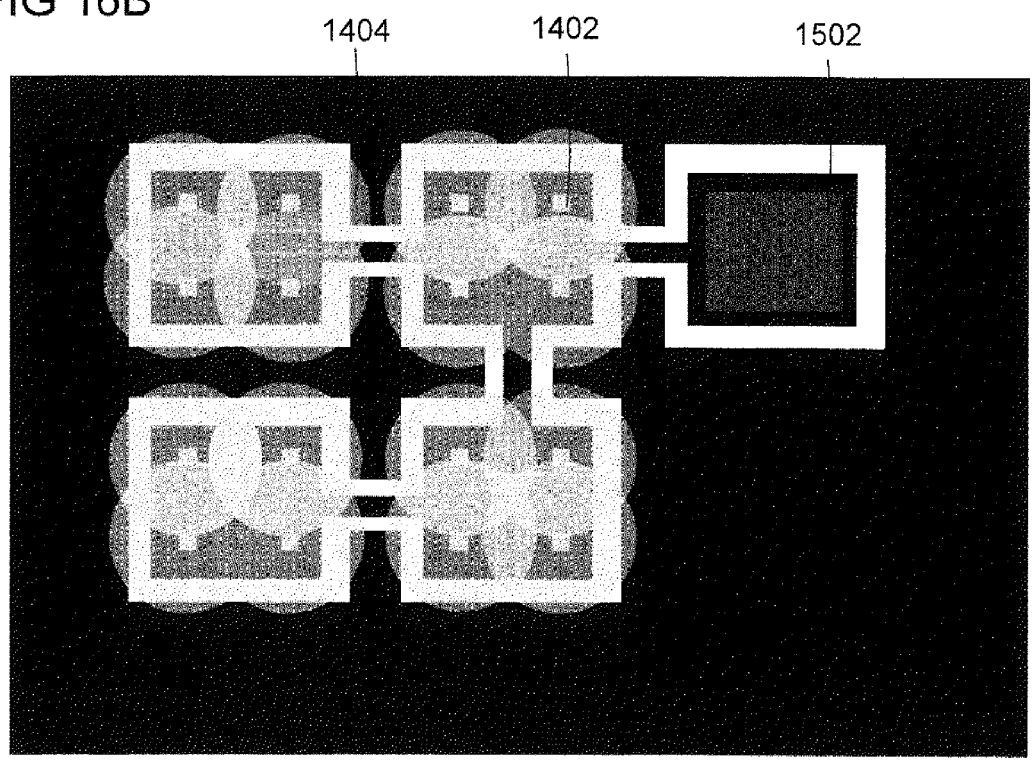

According to various embodiments, the sensor structure 100 manufactured by means of the above-described process and as illustrated in FIGS. 4 to 15A, may be implemented, as shown in FIGS. 16A and 16B. The embodiment depicted in FIGS. 16A and 16B differs from the embodiment depicted in FIGS. 4 to 15A primarily in that the volume of the at least one enclosed chamber may be defined by the etching process used to form the at least one enclosed chamber 1404.

According to various embodiments, the sensor structure 100 manufactured by means of the above-described process and as illustrated in FIGS. 4 to 15A, may be implemented, as shown in FIG. 17. The embodiment depicted in FIG. 17 may contain two electrically conductive layers 1702 and 1708, respectively. The conductive layers 1702 and 1708 may be electrically isolated from one another by a pillar structure 1710. The pillar structure 1710 may be arranged to mechanically join the conductive layers 1702 and 1708. According to various embodiments, the pillar structure 1710 may be implemented as a plurality of pillar structures. According to various embodiments, the sensor structure 100, as depicted in FIG. 17, may include a an electrode element 1706. The electrode element 1706 may be arranged between the conductive layers 1702 and 1708. According to various embodiments, the electrode element 1706 may be fixed between the conductive layers 1702 and 1708 by an isolation layer 1704. The isolation layer 1704 may at least partially encapsulate the electrode element 1706. According to various embodiments, the pillar structure 1710 and the conductive layers 1702 and 1708 may define at least one chamber 1712. At least a portion of the electrode element 1706 may be contained by the at least one chamber 1712.

Figure 18:
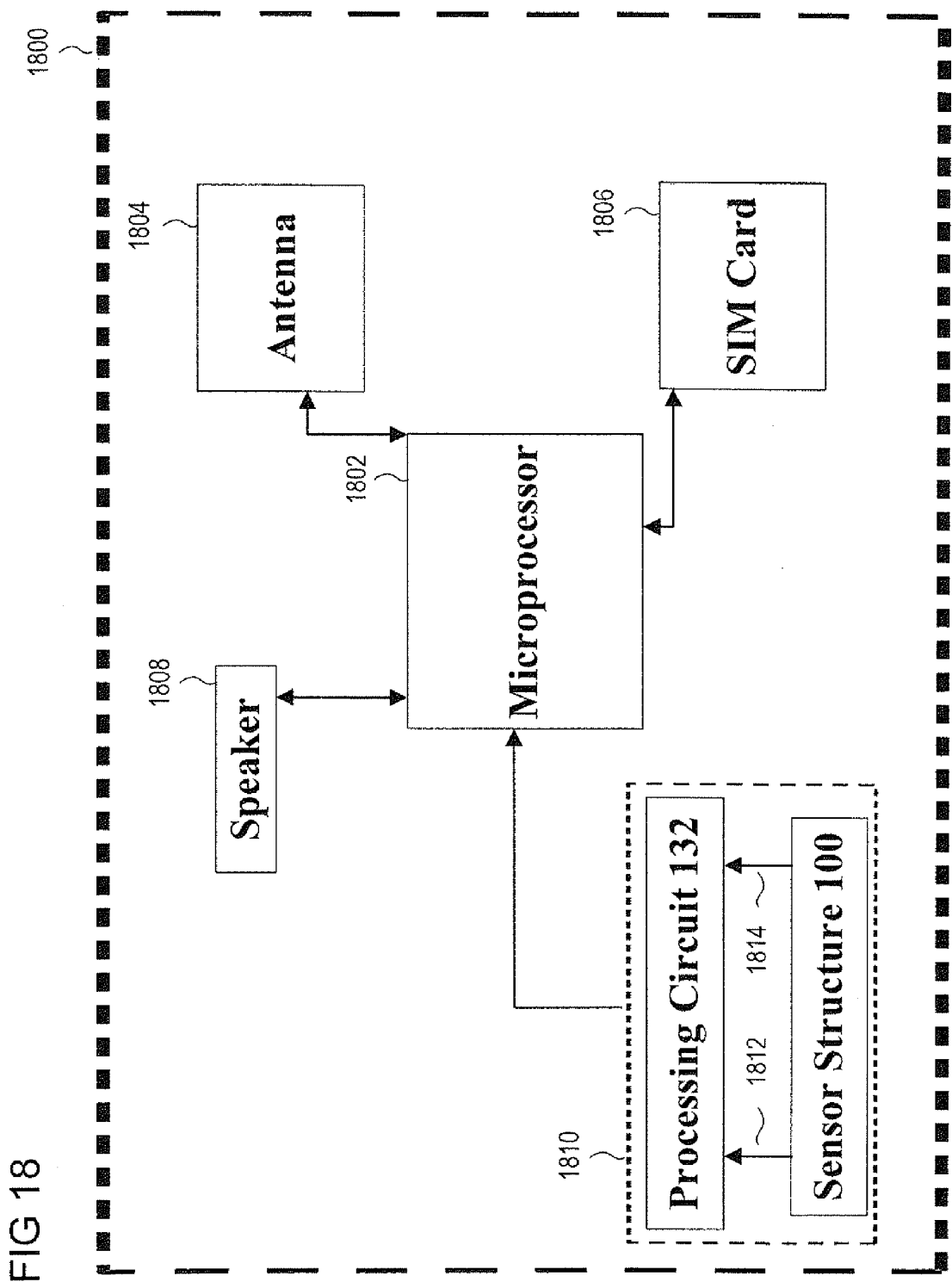
FIG. 18 shows a block diagram representation of the sensor structure from FIG. 1A integrated into a cellular telephone device in accordance with various embodiments.

According to various embodiments, as illustrated in FIG. 18, a sensor structure arrangement 1810 is disclosed. The sensor structure arrangement 1810 may include the sensor structure 100 and the optional processing circuitry 132. The sensor structure arrangement 1810 may be implemented in various electronic devices such as, e.g. a cellular telephone 1800. According to various embodiments, the sensor structure 100 may transmit information to the cellular telephone 1800 via the optional processing circuitry 132. According to various embodiments, the sensor structure 100 may be configured to transmit at least a first signal 1812 and a second signal 1814 to the optional processing circuitry 132. The first signal 1812 may be generated by the portion of the sensor structure 100 which may contain the pressure wave magnitude sensing structure, described above. The second signal 1814 may be generated by the portion of the sensor structure 100 which may contain the ambient pressure sensing structure, described above. According to various embodiments, the optional processing circuitry 132 may be configured to transmit a first signal 1812 to further processing circuitry, such as, a microprocessor 1802 which may be the main processing chip of the cellular telephone 1800. Additionally, the optional processing circuitry 132 may likewise be configured to transmit the second signal 1814 to the microprocessor 1802. Further the optional processing circuitry 132 may be configured to transmit both the first and second signals 1812 and 1814, respectively, to the microprocessor 1802. In various embodiments, the sensor structure arrangement 1810 may be configured to provide the microprocessor 1802 with a signal which may be used to determine the relative height above sea-level of the cellular telephone 1800. The signal which may allow the cellular telephone 1800 to determine its relative height above sea-level may be generated by the portion of the sensor structure 100 which may contain the ambient pressure sensing structure.

According to various embodiments optional processing circuitry 132 may be configured to transmit any combination of signals to a variety of additional processing devices as may be desired for a given application. In various embodiments, the sensor structure arrangement 1810 may be implemented in various other electronic devices such as Global Positioning System (GPS) devices, Subscriber Identity Module (SIM) cards, digital image capture devices, and various other devices as may be desirable for a given application.

Figure 19B:
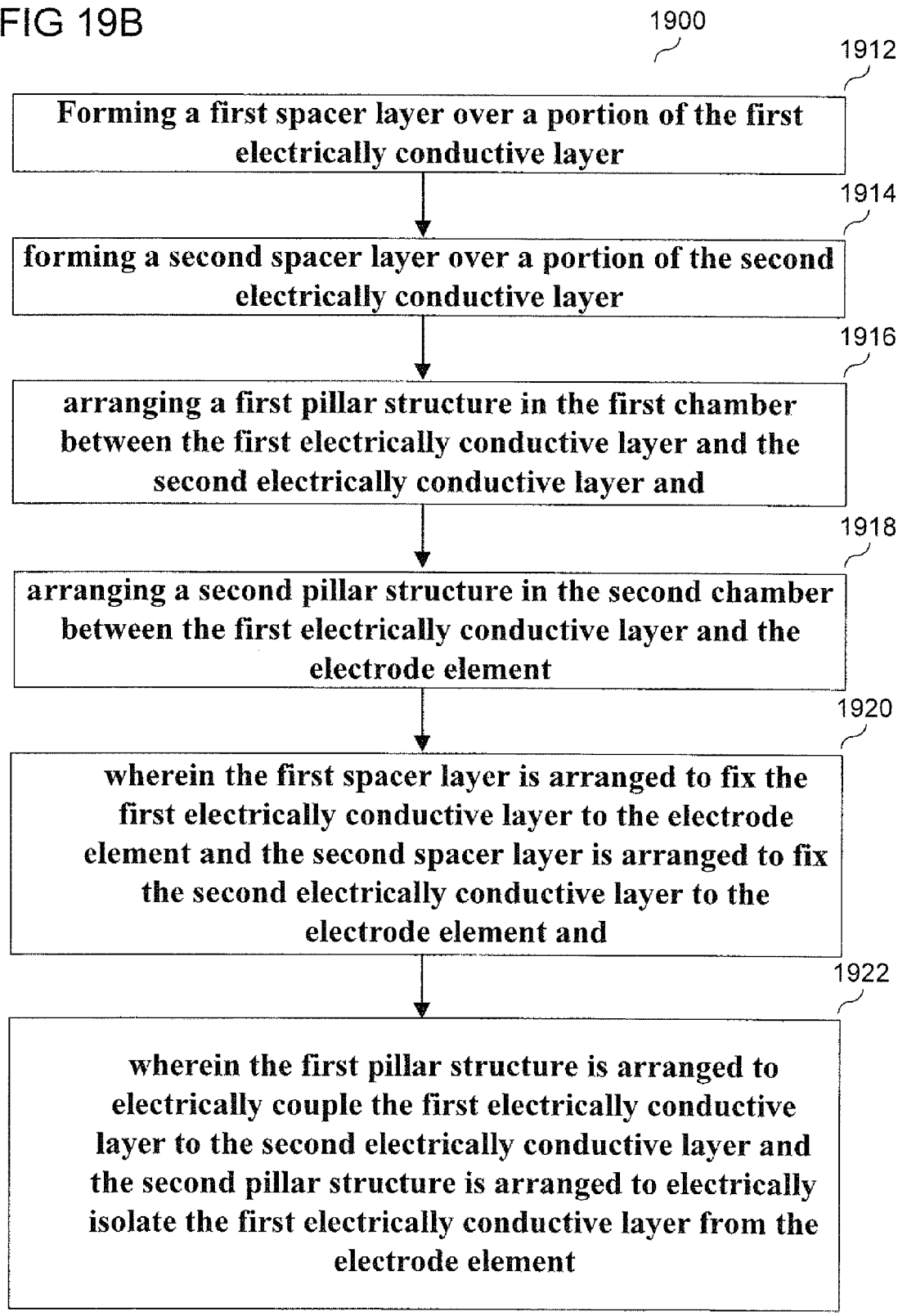

According to various embodiments, as illustrated in FIGS. 19A-19C, a method 1900 for forming a sensor structure is disclosed. The method may include, providing a support structure having a first side as shown in 1902; forming a first electrically conductive layer on the first side of the support structure as shown in 1904; arranging an electrode element over the first conductive layer as shown in 1906; arranging a second electrically conductive layer on an opposite side of the electrode element from the first electrically conductive layer as shown in 1908; and as shown in 1910, a portion of the first electrically conductive layer and a portion of the second electrically conductive layer may be configured to form a first chamber where the pressure in the first chamber may be lower than the pressure outside the first chamber and a further portion of the first electrically conductive layer and a portion of the electrode element may be configured to form a second chamber where the pressure in the second chamber may be lower than the pressure outside the second chamber. According to various embodiments, the method may further include, forming a first spacer layer over a portion of the first electrically conductive layer as shown in 1912; forming a second spacer layer over a portion of the second electrically conductive layer as shown in 1914; arranging a first pillar structure in the first chamber between the first electrically conductive layer and the second electrically conductive layer as shown in 1916; arranging a second pillar structure in the second chamber between the first electrically conductive layer and the electrode element as shown in 1918; further, as shown in 1920 the first spacer layer may be arranged to fix the first electrically conductive layer to the electrode element and the second spacer layer may be arranged to fix the second electrically conductive layer to the electrode element; and as shown in 1922 the first pillar structure may be arranged to electrically couple the first electrically conductive layer to the second electrically conductive layer and the second pillar structure may be arranged to electrically isolate the first electrically conductive layer from the electrode element. According to various embodiments, the method may further include, as shown in 1924, forming a cavity in the support structure; and forming a void through the first electrically conductive layer, the first spacer layer, the electrode element, the second spacer layer, and the second electrically conductive layer; as shown in 1926, at least a portion of the first electrically conductive layer may be suspended across the cavity in the support structure; and as shown in 1928, the void may be arranged to electrically isolate a portion of the sensor structure containing the first chamber from a portion containing the second chamber. According to various embodiments, a sensor structure is provided including a support structure having a first side; a first electrically conductive layer formed on the first side of the support structure; an electrode element arranged over the first conductive layer; and a second electrically conductive layer arranged on an opposite side of the electrode element from the first electrically conductive layer; where a portion of the first electrically conductive layer and a portion of the second electrically conductive layer form a first chamber where the pressure in the first chamber is lower than the pressure outside the first chamber and a further portion of the first electrically conductive layer and a portion of the electrode element form a second chamber where the pressure in the second chamber is lower than the pressure outside the second chamber.

According to various embodiments, the sensor structure may further include: a first spacer layer formed over a portion of the first electrically conductive layer; a second spacer layer formed over a portion of the second electrically conductive layer; a first pillar structure arranged in the first chamber between the first electrically conductive layer and the second electrically conductive layer; and a second pillar structure arranged in the second chamber between the first electrically conductive layer and the electrode element.

According to various embodiments, the electrode element may be at least partially arranged in the first chamber.

According to various embodiments, the pressure in the first chamber is substantially a vacuum pressure and the pressure in the second chamber is substantially a vacuum pressure.

According to various embodiments, the first spacer layer is arranged to fix the first electrically conductive layer to the electrode element and the second spacer layer is arranged to fix the second electrically conductive layer to the electrode element.

According to various embodiments, the first pillar structure is configured to electrically couple the first electrically conductive layer to the second electrically conductive layer.

According to various embodiments, the first pillar structure intersects the first chamber.

According to various embodiments, the second pillar structure is configured to electrically isolate the first electrically conductive layer from the electrode element.

According to various embodiments, the second pillar structure intersects the second chamber.

According to various embodiments, the sensor structure may further include: a cavity formed in the support structure; and a void formed through the first electrically conductive layer, the first spacer layer, the electrode element, the second spacer layer, and the second electrically conductive layer.

According to various embodiments, at least a portion of the first electrically conductive layer is suspended across the cavity in the support structure.

According to various embodiments, the void is configured to electrically isolate a portion of the sensor structure containing the first chamber from a portion containing the second chamber.

According to various embodiments, the sensor structure may be implemented as a micro-electro-mechanical system.

According to various embodiments, a sensor structure arrangement is disclosed. The sensor structure arrangement may include a sensor structure which may be composed of a support structure having a first side; a first electrically conductive layer which may be formed on the first side of the support structure; an electrode element which may be arranged over the first conductive layer; and a second electrically conductive layer which may be arranged on an opposite side of the electrode element from the first electrically conductive layer; where a portion of the first electrically conductive layer and a portion of the second electrically conductive layer may form a first chamber where the pressure in the first chamber may be lower than the pressure outside the first chamber and a further portion of the first electrically conductive layer and a portion of the electrode element may form a second chamber where the pressure in the second chamber may be lower than the pressure outside the second chamber;

and a circuit which may be configured to detect at least one of a signal generated by a deflection of the first chamber and a signal generated by a deformation of the second chamber.

According to various embodiments, a chip is disclosed. The chip may include a pressure sensor and a microphone where the pressure sensor and the microphone have at least one common layer of a substrate of the chip. In various embodiments, the microphone and the pressure sensor may share at least one layer which is monolithically formed in the substrate of the chip.

According to various embodiments an electronic device is disclosed. The electronic device may include a first chip. The first chip may include a pressure sensor, a microphone, and a circuit configured to process at least one signal provided by at least one of the pressure sensor or the microphone. According to various embodiments, the electronic device may be configured as a communication device. In various embodiments, the electronic device may further include a second chip configured to receive the at least one signal from the circuit. According to various embodiments the second chip may be implemented as a signal processing device. According to various embodiments the second chip may be implemented as a subscriber identification module (SIM). In various embodiments, the second chip may be implemented in various electronic devices such as, e.g. a cellular telephone. According to various embodiments, the second chip may be implemented as and/or integrated into any electronic device as may be desirable for a given application.

According to various embodiments, a method for forming a sensor structure may include: providing a support structure having a first side; forming a first electrically conductive layer on the first side; arranging an electrode element over the first conductive layer; arranging a second electrically conductive layer on an opposite side of the electrode element from the first electrically conductive layer; where a portion of the first electrically conductive layer and a portion of the second electrically conductive layer are configured to form a first chamber where the pressure in the first chamber is lower than the pressure outside the first chamber and a further portion of the first electrically conductive layer and a portion of the electrode element are configured to form a second chamber where the pressure in the second chamber is lower than the pressure outside the second chamber.

According to various embodiments, the method may further include: forming a first spacer layer over a portion of the first electrically conductive layer; forming a second spacer layer over a portion of the second electrically conductive layer; arranging a first pillar structure in the first chamber between the first electrically conductive layer and the second electrically conductive layer; and arranging a second pillar structure in the second chamber between the first electrically conductive layer and the electrode element.

According to various embodiments, the first spacer layer is arranged to fix the first electrically conductive layer to the electrode element and the second spacer layer is arranged to fix the second electrically conductive layer to the electrode element.

According to various embodiments, the first pillar structure is arranged to electrically couple the first electrically conductive layer to the second electrically conductive layer and the second pillar structure is arranged to electrically isolate the first electrically conductive layer from the electrode element.

According to various embodiments, the method may further include: forming a cavity in the support structure; and forming a void through the first electrically conductive layer, the first spacer layer, the electrode element, the second spacer layer, and the second electrically conductive layer.

According to various embodiments, at least a portion of the first electrically conductive layer is suspended across the cavity in the support structure.

According to various embodiments, the void is configured to electrically isolate a portion of the sensor structure containing the first chamber from a portion containing the second chamber.

While the disclosure has been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A sensor structure, comprising:
    a support structure having a first side;
    a first electrically conductive layer formed on the first side of the support structure;
    an electrode element arranged over the first conductive layer; and
  a second electrically conductive layer arranged on an opposite side of the electrode element from the first electrically conductive layer;
    wherein a portion of the first electrically conductive layer and a portion of the second electrically conductive layer form a first chamber where the pressure in the first chamber is lower than the pressure outside the first chamber and a further portion of the first electrically conductive layer and a portion of the electrode element form a second chamber where the pressure in the second chamber is lower than the pressure outside the second chamber.

2. The sensor structure of claim 1, further comprising:
    a first spacer layer formed over a portion of the first electrically conductive layer; a second spacer layer formed over a portion of the second electrically conductive layer;
    a first pillar structure arranged in the first chamber between the first electrically conductive layer and the second electrically conductive layer; and
    a second pillar structure arranged in the second chamber between the first electrically conductive layer and the electrode element.

3. The sensor structure of claim 2,
    wherein the electrode element is at least partially arranged in the first chamber.

4. The sensor structure of claim 2,
    wherein the pressure in the first chamber is substantially a vacuum pressure and the pressure in the second chamber is substantially a vacuum pressure.

5. The sensor structure of claim 2,
    wherein the first spacer layer is arranged to fix the first electrically conductive layer to the electrode element and the second spacer layer is arranged to fix the second electrically conductive layer to the electrode element.

6. The sensor structure of claim 2,
    wherein the first pillar structure is configured to electrically couple the first electrically conductive layer to the second electrically conductive layer.

7. The sensor structure of claim 2,
    wherein the first pillar structure intersects the first chamber.

8. The sensor structure of claim 2,
wherein the second pillar structure is configured to electrically isolate the first electrically conductive layer from the electrode element.
9. The sensor structure of claim 2,
wherein the second pillar structure intersects the second chamber.
10. The sensor structure of claim 2, further comprising:
a cavity formed in the support structure; and
a void formed through the first electrically conductive layer, the first spacer layer, the electrode element, the second spacer layer, and the second electrically conductive layer.
11. The sensor structure of claim 10,
wherein at least a portion of the first electrically conductive layer is suspended across the cavity in the support structure.
12. The sensor structure of claim 10,
wherein the void is configured to electrically isolate a portion of the sensor structure containing the first chamber from a portion containing the second chamber.
13. The sensor structure of claim 1,
wherein the sensor structure comprises a micro-electromechanical system.

14. A sensor structure arrangement, comprising:
a sensor structure comprising:
   a support structure having a first side;
   a first electrically conductive layer formed on the first side of the support structure;
   an electrode element arranged over the first conductive layer; and
a second electrically conductive layer arranged on an opposite side of the electrode element from the first electrically conductive layer;
   wherein a portion of the first electrically conductive layer and a portion of the second electrically conductive layer form a first chamber where the pressure in the first chamber is lower than the pressure outside the first chamber and a further portion of the first electrically conductive layer and a portion of the electrode element form a second chamber where the pressure in the second chamber is lower than the pressure outside the second chamber; and
a circuit configured to detect at least one of a signal generated by a deflection of the first chamber and a signal generated by a deformation of the second chamber.

* * * * *